US012782827B2

(12) United States Patent
Nikolski et al.

(10) Patent No.: US 12,782,827 B2
(45) Date of Patent: Nov. 3, 2026

(54) LITHOGRAPHIC METHOD

(71) Applicant: ASML NETHERLANDS B.V., Veldhoven (NL)

(72) Inventors: Pioter Nikolski, Veldhoven (NL); Rick Jeroen Meijerink, Den Bosch (NL)

(73) Assignee: ASML NETHERLANDS, Veldhoven (NL)

( * ) Notice: Subject to any disclaimer, the term of this patent is extended or adjusted under 35 U.S.C. 154(b) by 164 days.

(21) Appl. No.: 18/039,484

(22) PCT Filed: Nov. 29, 2021

(86) PCT No.: PCT/EP2021/083398
§ 371 (c)(1),
(2) Date: May 30, 2023

(87) PCT Pub. No.: WO2022/135843
PCT Pub. Date: Jun. 30, 2022

(65) Prior Publication Data

US 2024/0004307 A1 Jan. 4, 2024

(30) Foreign Application Priority Data

Dec. 24, 2020 (EP) .................................... 20217240
Feb. 25, 2021 (EP) .................................... 21159175

(51) Int. Cl.
*G03F 7/00* (2006.01)

(52) U.S. Cl.
CPC .......... *G03F 7/706* (2013.01); *G03F 7/70575* (2013.01)

(58) Field of Classification Search
CPC ............... G03F 7/0037; G03F 7/70041; G03F 7/70333; G03F 7/70458; G03F 7/70466;
(Continued)

(56) References Cited

U.S. PATENT DOCUMENTS 4,937,619 A 6/1990 Fukuda et al.
6,952,253 B2 10/2005 Lof et al.
(Continued)

FOREIGN PATENT DOCUMENTS

JP H0758393 3/1995
TW 200931184 7/2009
(Continued)

OTHER PUBLICATIONS

International Search Report and Written Opinion issued in corresponding International Application No. PCT/EP2021/083398, dated Feb. 11, 2022.
(Continued)

*Primary Examiner* — Peter B Kim
(74) *Attorney, Agent, or Firm* — Pillsbury Winthrop Shaw Pittman, LLP

(57) ABSTRACT

A method of forming a pattern on a substrate using a lithographic apparatus provided with a patterning device and a projection system having chromatic aberrations, the method including: providing a radiation beam having a plurality of wavelength components to the patterning device; forming an image of the patterning device on the substrate using the projection system to form the pattern, wherein a position of the pattern is dependent on a wavelength of the radiation beam due to the chromatic aberrations; and controlling a spectrum of the radiation beam to control the position of the pattern.

21 Claims, 15 Drawing Sheets

(58) Field of Classification Search

CPC .. G03F 7/70558; G03F 7/70575; G03F 7/706; G03F 7/70616; G03F 7/70625; G03F 7/0041

See application file for complete search history.

(56) References Cited

U.S. PATENT DOCUMENTS

| | | | | |
|---|---|---|---|---|
| 10,545,410 | B2 | 1/2020 | Cekli et al. | |
| 11,054,813 | B2 | 7/2021 | Ypma et al. | |
| 11,520,239 | B2 | 12/2022 | Tel et al. | |
| 2002/0167975 | A1 | 11/2002 | Spangler et al. | |
| 2006/0016561 | A1 | 1/2006 | Choi et al. | |
| 2007/0085991 | A1 | 4/2007 | Liegl et al. | |
| 2009/0066927 | A1* | 3/2009 | Takenaka | G03F 9/7065 355/77 |
| 2010/0055621 | A1 | 3/2010 | Hatakeyama et al. | |
| 2010/0214550 | A1 | 8/2010 | Hulsebos et al. | |
| 2012/0008127 | A1 | 1/2012 | Tel et al. | |
| 2015/0186581 | A1 | 7/2015 | Chen et al. | |
| 2018/0314168 | A1 | 11/2018 | Van Haren et al. | |
| 2018/0348145 | A1 | 12/2018 | Witte et al. | |
| 2019/0204756 | A1* | 7/2019 | Patra | G03F 7/0037 |
| 2019/0243252 | A1 | 8/2019 | Frisco et al. | |
| 2019/0317412 | A1 | 10/2019 | Mos et al. | |
| 2020/0019067 | A1 | 1/2020 | Kou et al. | |
| 2020/0050180 | A1 | 2/2020 | Kou et al. | |
| 2020/0096877 | A1 | 3/2020 | Patra | |
| 2020/0233311 | A1 | 7/2020 | Kubis et al. | |
| 2020/0301286 | A1 | 9/2020 | Conley et al. | |
| 2020/0356012 | A1 | 11/2020 | Mos et al. | |

FOREIGN PATENT DOCUMENTS

| | | |
|---|---|---|
| WO | 2011/081645 | 7/2011 |
| WO | 2013/092106 | 6/2013 |
| WO | 2015/101458 | 7/2015 |
| WO | 2015/110191 | 7/2015 |
| WO | 2020/177979 | 9/2020 |

OTHER PUBLICATIONS

Office Action issued in corresponding Japanese Patent Application No. 2023-532450, dated Mar. 3, 2026.

* cited by examiner

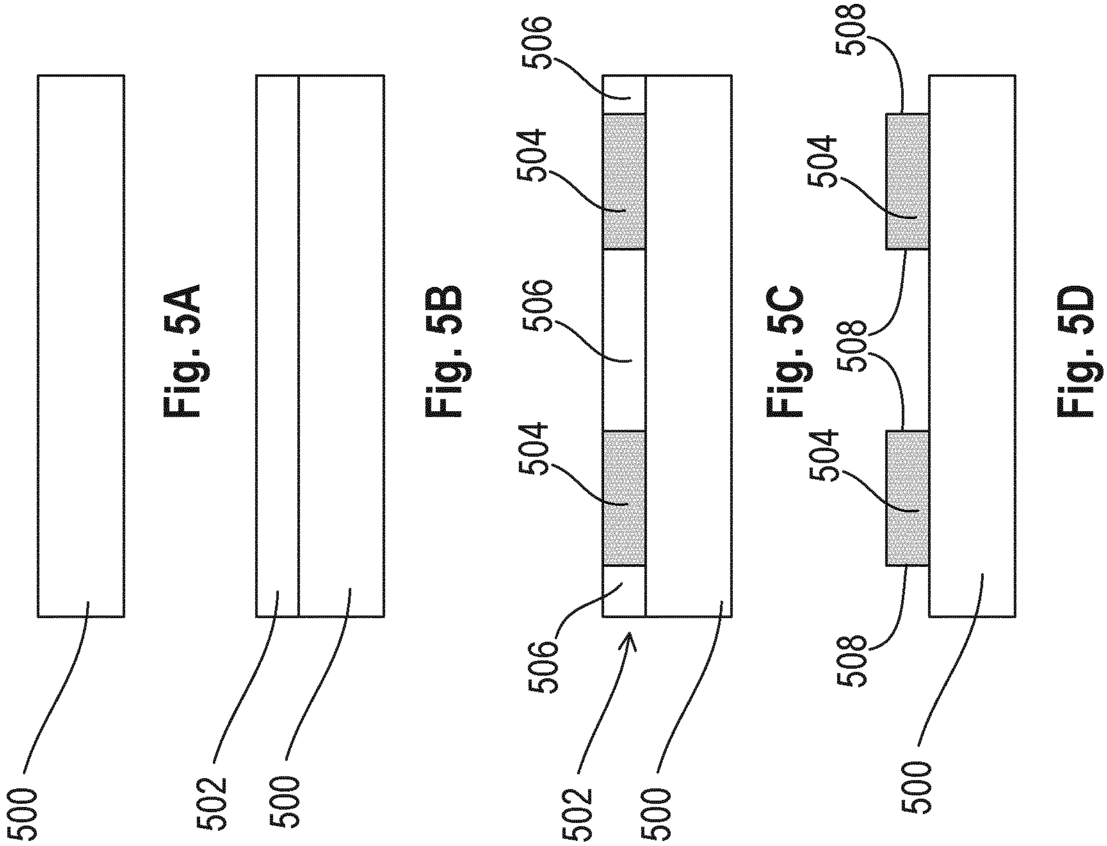
Fig. 5A
Fig. 5B
Fig. 5C
Fig. 5D
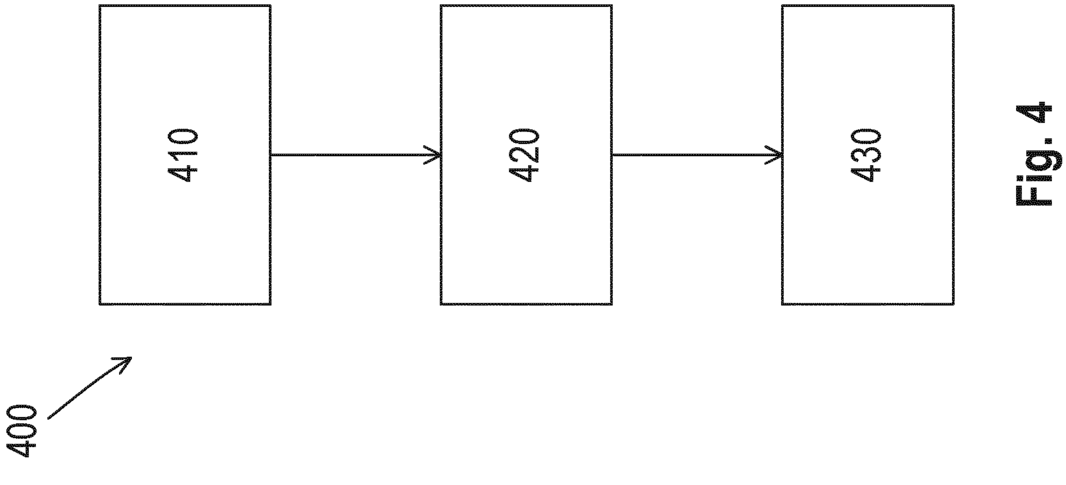
Fig. 4

LITHOGRAPHIC METHOD

This application is the U.S. national phase entry of PCT Patent Application No. PCT/EP2021/083398 which was filed on Nov. 29, 2021, which claims priority of European Patent Application No. 20217240.9 which was filed on Dec. 24, 2020, and of European Patent Application No. 21159175.5 which was filed on Feb. 25, 2021, and which are incorporated herein in their entireties by reference.

FIELD

The present invention relates to a method of forming a pattern feature on a substrate. The method may have particular, although not exclusive, application for multiple patterning or spacer lithography processes such as, for example, a sidewall assisted double patterning (SADP) process or a sidewall assisted quadrupole patterning (SAQP) process. Additionally or alternatively, the method may have particular, although not exclusive, application for lithography processes which are prone to overlay due to the presence of intra-field stress such as, for example, dynamic random access memory (DRAM) and three-dimensional NAND (3DNAND) flash memory processes.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

It may be desirable to provide methods and apparatus for forming pattern features on a substrate that at least partially address one or more problems in existing arrangements whether identified herein or otherwise.

SUMMARY

According to a first aspect of the invention there is provided a method of forming a pattern feature on a substrate, the method comprising: providing a radiation beam comprising a plurality of wavelength components; forming an image of a patterning device on the substrate with the radiation beam using a projection system to form an intermediate pattern feature on the substrate, wherein a plane of best focus of the image is dependent on a wavelength of the radiation beam; and controlling a spectrum of the radiation beam in dependence on one or more parameters of one or more subsequent processes applied to the substrate to form the pattern feature so as to control a dimension and/or position of the pattern feature.

The method according to the first aspect of the invention is advantageous, as now discussed.

The radiation beam may be a pulsed radiation beam. The plurality of wavelength components may be discrete wavelength components.

It will be appreciated that the method is a lithographic method. The steps of providing the radiation beam and forming the image of the patterning device may be performed within a lithographic apparatus (for example a scanner tool). The one or more subsequent processes may comprise subsequent processing steps such as baking, developing, etching, annealing, deposition, doping and the like. As such, in general, the formation of the pattern feature will be dependent both on exposure parameters within a lithographic apparatus and processing parameters outside of the lithographic apparatus.

The intermediate pattern feature may comprise a pattern formed by exposure of a substrate (for example coated with a layer of resist) in a lithographic apparatus. After exposure in the lithographic apparatus, the intermediate pattern feature may be considered to be formed if properties of the resist differ in regions which have received a threshold dose of radiation to regions that have not received the threshold dose of radiation.

In some embodiments, the method according to the first aspect may be a multiple patterning or spacer lithography process. For example, the method according to the first aspect may be a sidewall assisted double patterning (SADP) process or a sidewall assisted quadrupole patterning (SAQP) process. That is, the intermediate pattern feature may comprise a spacer feature formed by exposure of a substrate (for example coated with a layer of resist) in a lithographic apparatus. In such embodiments, the formation of the intermediate pattern region may further comprise development of the resist so as to selectively remove either regions which have received the threshold dose of radiation or regions that have not received the threshold dose of radiation. The pattern feature may comprise smaller features (formed with, for example, half the pitch of the intermediate pattern features) formed by one or more subsequent processes. With known spacer lithography processes, control over the dimensions and position of the patterning feature is predominantly achieved by control of the one or more subsequent processing steps (for example etching and deposition parameters).

In some other embodiments, the pitch of the pattern features may have substantially the same pitch as the intermediate pattern features. In such embodiments, the formation of the pattern region may comprise development of the resist so as to selectively remove either regions which have received the threshold dose of radiation or regions that have not received the threshold dose of radiation. A lithographic exposure method that uses a radiation beam comprising a plurality of wavelength components is known as a multi focal imaging (MFI) process. Such arrangements have been used to increase a depth of focus of an image formed by a lithographic apparatus.

Advantageously, the method of the first aspect uses control of the spectrum of the radiation beam to provide control over a dimension and/or position of the pattern feature formed on the substrate. The method of the first aspect exploits the fact that aberrations of the projection system are, in general, wavelength dependent (known as chromatic aberrations). As used herein, aberrations of a projection system may represent distortions of a wavefront of the radiation beam approaching a point in an image plane of the projection system from a spherical wavefront. Therefore, each of the plurality of wavelength components will be subject to different aberrations and, in turn, characteristics of the contribution to the image from each of the plurality of wavelength components will, in general, be different.

An example of a characteristic of the contribution to the image from each of the plurality of wavelength components that may be different for each spectral component is a plane of best focus of that contribution. Therefore, in some embodiments, the method of the first aspect exploits the fact that different spectral components will, in general, be focused at different planes within or proximate to the substrate. This may be because aberrations which contribute to a defocus of the image are different for each of the plurality of wavelength components. Therefore, doses of radiation provided by the different spectral components will be deposited in different regions of the substrate, said region generally centered on a plane of best focus of that spectral component. Therefore, by controlling the spectrum of the radiation beam the planes of best focus for each spectral component and/or a dose of radiation delivered by each spectral component may be controlled. In turn, this provides control over the dimensions of the intermediate pattern features, which in turn can provide control over the dimensions of the pattern features. In addition, control over the spectrum of the radiation beam provides control over a shape of the intermediate pattern features, in particular sidewall parameters (for example angle and linearity) of the intermediate pattern feature, which in turn can provide control over the position and dimensions of the pattern features.

Previously, control over the sidewall angle of spacer features has been proposed by controlling an overall focus of the image while forming the intermediate pattern features. However, such an arrangement can only provide control at the expense of imaging performance and contrast. Furthermore, overall focus of an image within a lithographic exposure process is typically controlled by controlling a position (for example height) of the substrate (for example using a wafer stage that supports the substrate), which may be limited to a range of achievable accelerations. In contrast to such previous methods, which control a height of the substrate using a wafer stage that supports the substrate, the method according to the first aspect controls a spectrum of the radiation beam. The spectrum of the radiation beam can be controlled on a time scale that is significantly less than an exposure time of the substrate. For example, the radiation beam may be a pulsed radiation beam and the spectrum of the radiation beam may be controlled pulse to pulse (and the exposure may last for tens or hundreds of pulses). Therefore, the method according to the first aspect (which is not limited by a range of achievable accelerations of a wafer stage) allows for higher spatial frequency corrections to be applied than with previous methods.

Advantageously, the method of the first aspect allows a sidewall parameter of the intermediate pattern feature formed on the substrate to be controlled by controlling the spectrum of the radiation beam. In particular, this control is in dependence on one or more parameters of the one or more subsequent processes applied to the substrate to form the pattern feature on the substrate. This allows, for example, for any errors in the pattern feature on the substrate arising from the one or more subsequent processes applied to the substrate to be corrected for by controlling multi focal imaging parameters.

Another example of a characteristic of the contribution to the image from each of the plurality of wavelength components that may be different for each spectral component is a position of the image in a plane of the image. Therefore, in some embodiments, the method of the first aspect exploits the fact that different spectral components will, in general, be focused at different positions in a plane of the substrate. This may be because aberrations that contribute to the position of the image are different for each of the plurality of wavelength components. Therefore, contributions to the image provided by the different spectral components will be deposited in different positions in the plane of the substrate. Therefore, by controlling the spectrum of the radiation beam the position of each spectral component and/or a dose of radiation delivered by each spectral component may be controlled. In turn, this provides control over the position the intermediate pattern features, which in turn can provide control over the position of the pattern features.

Typically, the alignment of a substrate with an image formed by the projection system within a lithographic exposure process is controlled by controlling a position (in a plane of the substrate) of the substrate (for example using a wafer stage that supports the substrate). Again, such movements of the substrate are limited to a range of achievable accelerations of the wafer stage. In contrast to such previous methods, the method according to the first aspect controls a spectrum of the radiation beam. Again, the spectrum of the radiation beam can be controlled on a time scale that is significantly less than an exposure time of the substrate. For example, the radiation beam may be a pulsed radiation beam and the spectrum of the radiation beam may be controlled pulse to pulse (and the exposure may last for tens or hundreds of pulses). Therefore, the method according to the first aspect (which is not limited by a range of achievable accelerations of a wafer stage) allows for higher spatial frequency corrections to be applied than with previous methods. This can be used, for example, to control placement of the pattern feature (i.e. overlay) at relatively high spatial frequency. This may have application, for example, for overlay control due to the presence of intra-field stress for dynamic random access memory (DRAM) and three-dimensional NAND (3DNAND) flash memory processes.

The radiation beam comprises a plurality of wavelength components. It will be appreciated that this can be achieved in a plurality of different ways.

In some embodiments, each of the plurality of pulses may comprise a single wavelength component. The plurality of discrete components may be achieved by a plurality of different sub-sets of pulses within the plurality of pulses, each sub-set comprising a different single wavelength component. For example, in one embodiment the radiation beam may comprise two sub-sets of pulses: a first sub-set comprising a single first wavelength component $\lambda_1$ and a second sub-set comprising a single second wavelength component $\lambda_2$, the first wavelength component $\lambda_1$ and the second wavelength component $\lambda_2$ separated by $\Delta\lambda$. The pulses may alternate between pulses from the first and second sub-sets (i.e. a pulse having the first wavelength $\lambda_1$ followed by a pulse having the second wavelength component $\lambda_2$ followed by a pulse having the first wavelength $\lambda_1$ and so on).

Alternatively, each of the pulses may comprise a plurality of wavelength components.

It will be appreciated that controlling the spectrum of the radiation beam may be intended to mean controlling an integrated or time averaged spectrum of the pulsed radiation as received by a point on the substrate.

Controlling the spectrum of the radiation beam may comprise controlling a wavelength of at least one of the plurality of wavelength components.

This can control a plane of best focus of the at least one of the plurality of wavelength components. In turn, this allows control over a position (within the substrate) to which a dose of the at least one of the plurality of wavelength components is delivered.

Additionally or alternatively, controlling the spectrum of the radiation beam may comprise controlling a dose of at least one of the plurality of wavelength components.

It will be appreciated that a total dose of radiation delivered to any part of the substrate may be controlled (for example as part of a feedback loop controlling a power of a radiation source that produces the plurality of pulses). However, independent of such overall or total dose control, the relative doses of the plurality of wavelength components can be controlled. For example, the doses of the plurality of wavelength components can be controlled by controlling the relative intensities of the plurality of wavelength components. For example, dose can be controlled by controlling the number of pulses containing each of the plurality of wavelength components.

Forming the image of the patterning device on a substrate with the radiation beam may comprise patterning the radiation beam using a patterning device; and projecting the patterned radiation beam onto the substrate.

The method may further comprise controlling an overall focus of the radiation beam independently of the spectrum of the radiation beam.

Overall focus may be determined in dependence on a topology of the substrate. For example, once loaded into a lithographic apparatus and clamped to a support (for example a wafer stage), a topology of the substrate may be determined using a level sensor or the like. The determined topology of the substrate may be used during exposure of the substrate to the radiation beam to keep the substrate at or close to a total or overall plane of best focus.

The spectrum of the radiation beam and the overall focus of the radiation beam may be co-optimised.

The method may further comprise controlling a total dose independently of the spectrum of the radiation beam.

The total dose of radiation may be controlled to provide control over a critical dimension of the intermediate pattern feature. The spectrum of the radiation beam and the total dose may be co-optimised.

Before providing the radiation beam and forming the image of the patterning device, the method may comprise providing a surface of the substrate with a first layer of material. The image of the patterning device may be formed on or in the first layer of material.

The method may further comprise applying one or more subsequent processes to the substrate to form the pattern feature on the substrate.

The method according to the first aspect may be a multiple patterning or spacer lithography process. For example, method according to the first aspect may be a sidewall assisted double patterning (SADP) process or a sidewall assisted quadrupole patterning (SAQP) process.

The one or more subsequent processes applied to the substrate may comprise: developing a layer of material on the substrate to form the intermediate pattern feature; providing a second layer of material over the intermediate pattern feature, the second layer of material providing a coating on sidewalls of the intermediate pattern feature; removing a portion of the second layer of material, leaving a coating of the second layer of material on sidewalls of the intermediate pattern feature; and removing the intermediate pattern feature formed from the first layer of material, leaving on the substrate at least a part of the second layer of material that formed a coating on sidewalls of that intermediate pattern feature, the part of the second layer of material left on the substrate forming pattern features in locations adjacent to the locations of sidewalls of the removed intermediate pattern feature.

Controlling the spectrum of the radiation beam may provide control over a sidewall angle of the sidewalls of the intermediate pattern feature, thereby affecting a dimension of the coating of the second layer of material on the sidewalls of the intermediate pattern feature.

The one or more subsequent processes applied to the substrate may comprise: developing a layer of material on the substrate to form the pattern feature.

The one or more parameters of the one or more subsequent processes applied to the substrate may be determined from a measurement of a previously formed pattern feature.

That is, a pattern feature on a previously formed substrate may be measured in order to determine dimensions and/or positions of the pattern feature. For example, a metrology tool may be used to determine a pitch or pitch variation (known as pitch walk) of the pattern feature on the previously formed substrate. Additionally or alternatively, a metrology tool may be used to determine an overlay of the pattern feature on the previously formed substrate. As used here (and as known in the art), overlay is intended to mean an error in the relative position of a feature (for example, relative to a previously formed feature on the substrate).

Controlling the spectrum of the radiation beam may comprise changing the spectrum of the radiation beam relative to a nominal or default spectrum for a subset of the intermediate pattern feature.

For example, the control provided by spectral control of the radiation beam may only be undertaken if the intermediate pattern feature is of a specific type (for example a critical feature). Less critical features (for example high contrast features) may be formed using the nominal or default spectrum.

In some embodiments, the method may comprise forming a plurality of intermediate pattern features and a plurality of pattern features therefrom.

The substrate may comprise a plurality of target portions. Forming the image of the patterning device on the substrate with the radiation beam using a projection system to form the intermediate pattern feature may comprise forming said image on each of the plurality of target portions to form the intermediate pattern feature on each of the plurality of target portions. The control of the spectrum of the radiation beam may be dependent on the target portion upon which the image of the patterning device is being formed.

For example, the spectrum of the radiation beam may be controlled differently for central target portions of the substrate and for edge target portions of the substrate. That is, the spectral control may be field dependent. For example, the spectrum of the radiation beam may be at, or closer to, a nominal or default spectrum for central target portions of the substrate whereas a greater deviation from said nominal or default spectrum may be used for edge target portions of the substrate.

For such embodiments wherein the substrate comprises a plurality of target portions, the one or more subsequent processes applied to the substrate to form the pattern feature may comprise subsequent processing of the substrate to form the pattern feature on each of the plurality of target portions.

The control of the spectrum of the radiation beam may comprise varying the spectrum of the radiation beam while forming the image of the patterning device on the substrate.

That is, the method may comprise dynamic control of the spectrum of the radiation beam that is applied during exposure of the substrate. It will be appreciated that the exposure may be a scanning exposure and therefore such dynamic control of the spectrum of the radiation beam may allow different corrections to be applied for different parts of the exposed field. Such corrections may be referred to as intra-field corrections.

For embodiments wherein the substrate comprises a plurality of target portions, in general, different intra-field corrections may be applied to each different target portion.

Forming the image of the patterning device on the substrate may comprise a scanning exposure wherein the patterning device and/or the substrate are moved relative to the radiation beam as the image is being formed.

The method may further comprise transferring the pattern feature to the substrate.

The method may further comprise controlling one or more parameters of the projection system to maintain a set point aberration independently of the spectrum of the radiation beam. The set point aberration may be co-optimized with the control of the spectrum of the radiation beam.

According to a second aspect of the invention there is provided a lithographic system comprising: a radiation source operable to produce a radiation beam comprising a plurality of wavelength components; an adjustment mechanism operable to control a spectrum of the radiation beam; a support structure for supporting a patterning device such that the radiation beam can be incident on said patterning device; a substrate table for supporting a substrate; a projection system operable to project the radiation beam onto a target portion of the substrate so as to form an image of the patterning device on the substrate wherein a plane of best focus of the image is dependent on a wavelength of the radiation beam; and a controller operable to control the adjustment mechanism so as to configure the image based on an expected characteristic of one or more subsequent processes targeted to translate the image to a pattern on the substrate.

According to a third aspect of the invention there is provided a method for determining a spectrum or a spectrum correction for a radiation beam comprising a plurality of wavelength components for use in forming an image of a patterning device on a substrate, the method comprising: measuring the one or more parameters of a previously formed pattern feature; determining a correction based on the one or more measured parameters; and determining the spectrum or spectrum correction for a radiation beam based on the correction.

A spectrum or spectrum correction determined by the method according to the third aspect may be used in the method according to the first aspect.

According to the third aspect of the invention, a pattern feature on a previously formed substrate may be measured in order to determine dimensions and/or positions of the pattern feature. The pattern feature on the previously formed substrate have been formed by forming an image of a patterning device on the substrate with a radiation beam using a nominal or default spectrum and subsequently applying one or more subsequent processes applied to the substrate to form the pattern feature.

The one or more parameters of a previously formed pattern feature may characterize an error in the position and/or dimension of the previously formed pattern feature. For example, a metrology tool may be used to determine pitch variation (known as pitch walk) of the pattern feature on the previously formed substrate. Additionally or alternatively, a metrology tool may be used to determine an overlay of the pattern feature on the previously formed substrate (i.e. an error in the position of the feature).

The spectrum or spectrum correction may comprise controlling a wavelength or wavelength correction of at least one of the plurality of wavelength components.

The spectrum or spectrum correction may comprise a dose or dose correction of at least one of the plurality of wavelength components.

The substrate may comprise a plurality of target portions and a spectrum or spectrum correction may be determined for each of the plurality of target portions. That is, the spectrum or spectrum correction may be field dependent.

The spectrum or spectrum correction may be determined as a function of position on the substrate. That is, in general, the spectrum or spectrum correction varies in dependence on position on the substrate.

According to a fourth aspect of the invention there is provided a computer program comprising program instructions operable to perform the method according to the first aspect of the invention when run on a suitable apparatus.

The program instructions may comprise a spectrum or spectrum correction determined by the method according to the third aspect of the invention.

According to a fifth aspect of the invention there is provided a computer program comprising program instructions operable to perform the method according to the third aspect of the invention when run on a suitable apparatus.

According to a sixth aspect of the invention there is provided a non-transient computer program carrier comprising the computer program of the fourth or fifth aspects of the invention.

According to a seventh aspect of the invention there is provided a method of forming a pattern on a substrate using a lithographic apparatus provided with a patterning device and a projection system having chromatic aberrations, the method comprising: providing a radiation beam comprising a plurality of wavelength components to the patterning device; forming an image of the patterning device on the substrate using the projection system to form said pattern, wherein a position of the pattern is dependent on a wavelength of the radiation beam due to said chromatic aberrations; and controlling a spectrum of the radiation beam to control the position of the pattern.

According to an eight aspect of the invention there is provided A computer program product comprising machine readable instructions for determining a spectrum of a radiation beam comprising a plurality of wavelength components used in forming an image of a patterning device on a substrate in a lithographic apparatus, wherein the lithographic apparatus comprises a projection system having chromatic aberrations, the instructions configured to: obtain a dependency of a position on the substrate of a pattern associated with the patterning device on a wavelength of the radiation beam due to said chromatic aberrations; and determine the spectrum of the radiation beam based on a desired position of the pattern on the substrate and said dependency.

BRIEF DESCRIPTION OF THE DRAWINGS

Embodiments of the invention will now be described, by way of example only, with reference to the accompanying schematic drawings, in which:

FIG. 4 is a schematic block diagram for a method of forming a pattern feature on a substrate according to an embodiment of the present invention;

FIGS. 5A to 5D are schematic representations of a process for forming a pattern by exposure of a substrate (for example coated with a layer of resist) in a lithographic apparatus;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
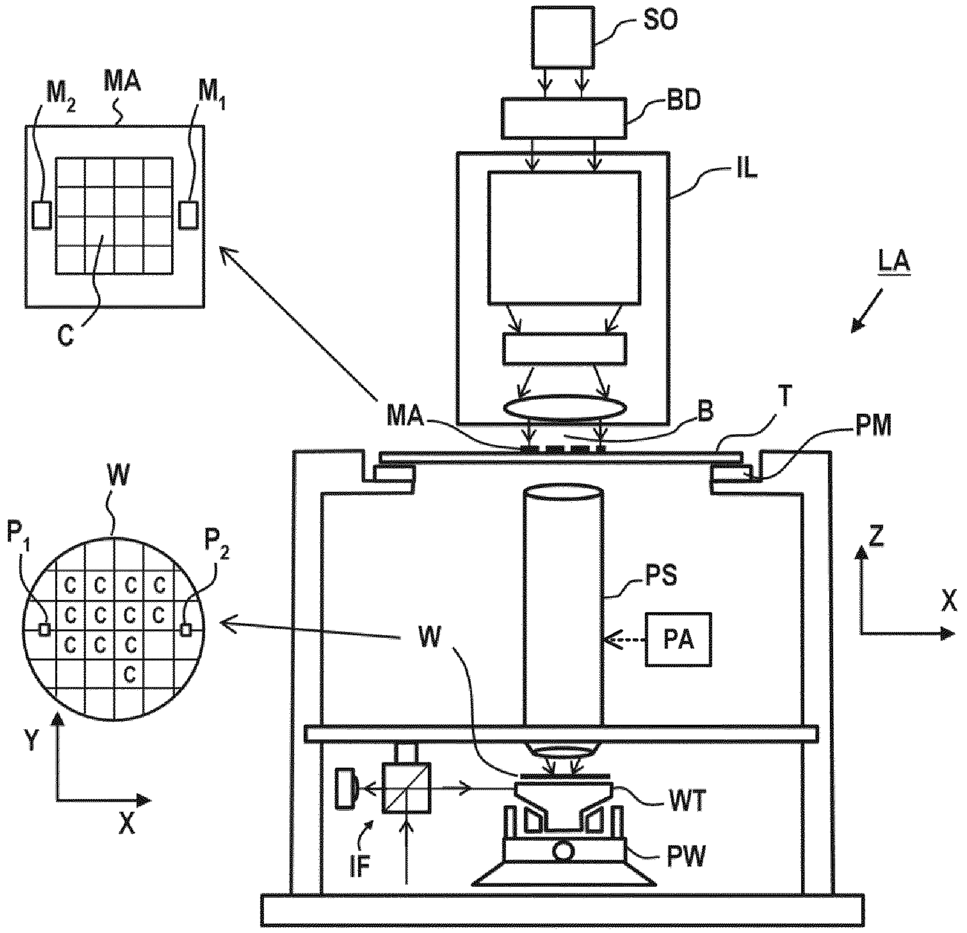
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA. The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such a "multiple stage" machine, the substrate supports WT may be used in parallel, and/or steps in preparation of a subsequent exposure of the substrate W may be carried out on the substrate W located on one of the substrate supports WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

The projection system PS is arranged to form a (resolution limited) image of the patterning device MA on the substrate W. It will be appreciated that the plane of the patterning device MA (which may be referred to as an object plane) is conjugate to the plane of the substrate W (which may be referred to as an image plane). As used herein the plane of the patterning device MA, the plane of the substrate W and any other mutually conjugate planes may be referred to as field planes.

The shape and (spatial) intensity distribution of the conditioned beam of radiation B are defined by optics of the illuminator IL. In a scan mode, the conditioned radiation beam B may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target region C that can be exposed in a single dynamic exposure. In contrast, the extent in the scanning direction of the target region C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. This plane may be stationary with respect to the projection system PS. The terms "slit profile", "profile of the radiation beam", "intensity profile" and "profile" may be used interchangeably to refer to the shape of the (spatial) intensity distribution of the slit, especially in the scanning direction. In a plane perpendicular to an optical axis of the lithographic apparatus, an exposure region may refer to a region of the plane (for example a field plane) which can receive radiation.

The illuminator IL illuminates an exposure region of the patterning device MA with radiation beam B and the projection system PS focuses the radiation at an exposure region in a plane of the substrate W. The illuminator IL may comprise masking blades that can be used to control the length and the width of the slit of radiation beam B, which in turn limits the extent of the exposure regions in the planes of the patterning device MA and the substrate W respectively. That is the masking blades of the illuminator serve as a field stop for the lithographic apparatus.

The illuminator IL may comprise an intensity adjustor (not shown), which may be operable to partially attenuate the radiation beam on opposing sides of the radiation beam B. The intensity adjustor may, for example, comprise a plurality of pairs of movable fingers, each pair comprising one finger on each side of the slit (i.e. each pair of fingers is separated in the scanning direction). The pairs of fingers F are arranged along the length of the slit (i.e. at different positions in the non-scanning direction). Each movable finger is independently movable in the scanning direction to control an extent to which it is disposed in the path of the radiation beam B. By moving the movable fingers, the shape and/or the intensity distribution of the slit can be adjusted. The fingers may be in a plane which is not a field plane of the lithographic apparatus LA and the field may be in the penumbra of the fingers such that the fingers do not sharply cut off the radiation beam B. The pairs of fingers may be used to apply a different level of attenuation of the radiation beam B along the length of the slit.

In a scan mode, the first positioning device PM is operable to move the support structure MT relative to the beam of radiation B that has been conditioned by the illuminator IL along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PS onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT.

In order to form an image of the patterning device MA on the substrate W, the substrate table WT is moved such that the conjugate point in the plane of the substrate W of each point on the patterning device MA remains stationary with respect to the substrate W. The velocity (both magnitude and direction) of the substrate table WT relative to the projection system PS is determined by the demagnification and image reversal characteristics of the projection system PS (in the scanning direction). In particular, if the characteristics of the projection system PS are such that the image of the patterning device MA that is formed in the plane of the substrate W is inverted in the scanning direction then the substrate table WT should be moved in the opposite direction to the support structure MT. That is, the motion of the substrate table WT2 should be anti-parallel to the motion of the support structure MT. Further, if the projection system PS applies a reduction factor $\alpha$ to the radiation beam PB then the distance travelled by each conjugate point in a given time period will be less than that travelled by the corresponding point on the patterning device by a factor of $\alpha$. Therefore the magnitude of the velocity $|v_{WT}|$ of the substrate table WT should be $|v_{MT}|/\alpha$.

Figure 2:
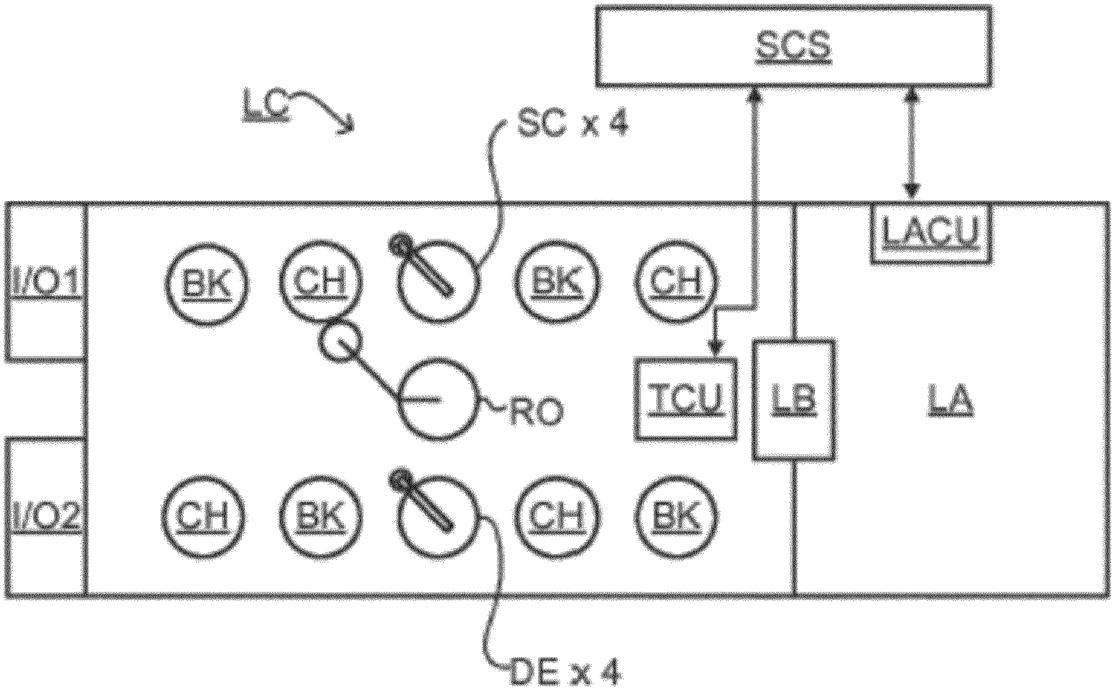
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
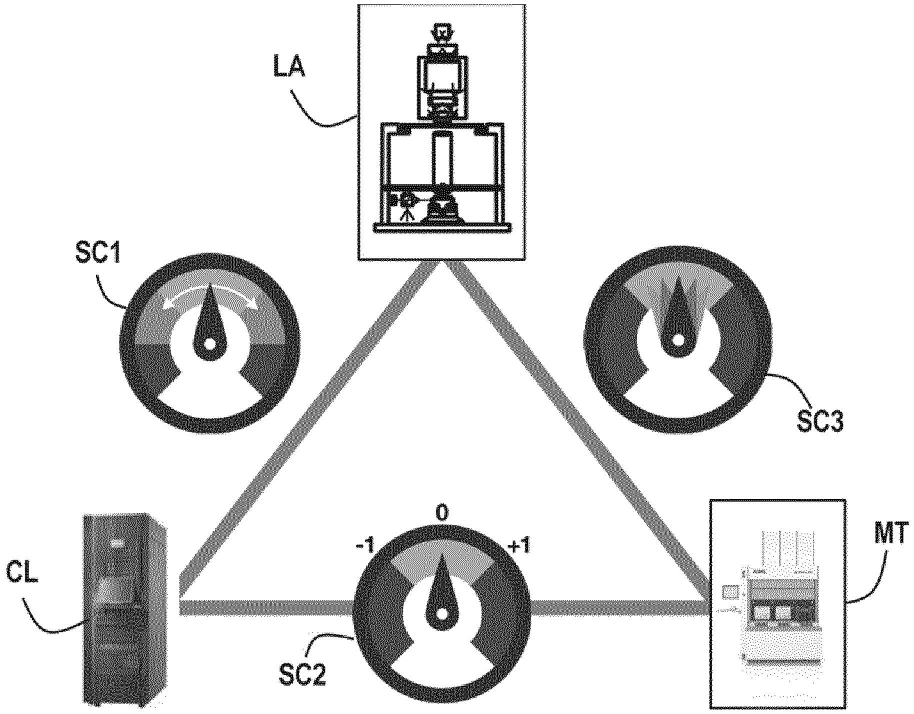
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As a semiconductor manufacturing process involves multiple processing apparatus (lithographic apparatus, etching stations, etc.) it may be beneficial to optimize the process as a whole, e.g. take specific correction capabilities associated with individual processing apparatus into account. This leads to the perspective that control of a first processing apparatus may be (partly) based on known control properties of a second processing apparatus. This strategy is commonly referred to as co-optimization. Examples of such a strategy are the joint optimization of a lithographic apparatus and a density profile of a patterning device and a lithographic apparatus and an etching station. More information on co-optimization may be found in international Patent application, application No. PCT/EP2016/072852 and US. Patent provisional application No. 62/298,882 which are incorporated herein by reference.

In some process control situations, the control objective may be, for example, “number of dies in spec”—typically being a yield driven process control parameter to obtain a maximum number of functional products (typically a product is associated with a die on a substrate, hence often yield based process control is referred to as based on a “Dies In Spec” criterion) per batch of processed substrates. To obtain good yield based process control sampling scheme for metrology measurements may benefit from measures performed at, on or near locations which are expected to be most critical for yield and/or may be statistically most relevant to determine whether yield is affected. Apart from measuring properties of product features also occurrence of defects may be measured to further assist in optimizing the process for optimal yield (reference defect inspection). More information on yield based control may be found in European patent application, application No. EP16195819.4 which is incorporated herein by reference.

The lithographic apparatus LA is configured to accurately reproduce the pattern onto the substrate. The positions and dimensions of the applied features need to be within certain tolerances. Position errors may occur due to an overlay error (often referred to as “overlay”). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (CD) errors may e.g. occur when the substrate is not positioned correctly with respect to a focal plane of the lithographic apparatus. These focal position errors may be associated with unflatness of a substrate surface. The lithographic apparatus minimizes these focal position errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may e.g. be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs it is of great importance that the process conditions for processing substrates using processing apparatus such as the lithographic apparatus or etching station remain stable such that properties of the features remain within certain control limits Stability of the process is of particular importance for features of the functional parts of the IC, the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as “Advanced Process Control” (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the product features. In that case a so-called “Metrology To Device” offset (further also referenced to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of the locations across the substrate and/or patterning device where the metrology targets are present and/or measured is often referred to as the “sampling scheme”. Typically the sampling scheme is selected based on an expected fingerprint of the relevant process parameter(s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput of the lithographic process. A carefully selected sampling scheme is important to accurately control the lithographic process without affecting throughput and/or assigning a too large area on the reticle or substrate to metrology features. Technology related to optimal positioning and/or measuring metrology targets is often referred to as “scheme optimization”. More information on scheme optimization can be found in international Patent Application Publication No. WO 2015110191 and the European patent application, application number EP16193903.8 which are incorporated herein by reference.

Besides metrology measurement data also context data may be used for process control. Context data may comprise data relating to one or more of: the selected processing tools (out of the pool of processing apparatus), specific characteristics of the processing apparatus, the settings of the processing apparatus, the design of the circuit pattern and measurement data relating to processing conditions (for example wafer geometry). Examples of using context data for process control purposes may be found in the European patent application, application number EP16156361.4, and the international patent application, application number PCT/EP2016/072363 which are incorporated herein by reference. Context data may be used to control or predict processing in a feed-forward manner in case the context data relates to process steps performed before the currently controlled process step. Often context data is statistically correlated to product feature properties. This enables context driven control of processing apparatus in view of achieving optimal product feature properties. Context data and metrology data may also be combined e.g. to enrich sparse metrology data to an extent that more detailed (dense) data becomes available which is more useful for control and/or diagnostic purposes. More information on combining context data and metrology data can be found in U.S. Patent provisional application No. 62/382,764 which is incorporated herein by reference.

As said monitoring the process is based on acquisition of data related to the process. The required data sampling rate (per lot or per substrate) and sampling density depend on the required level of accuracy of pattern reproduction. For low-k1 lithographic processes even small substrate to substrate process variations may be significant. The context data and/or metrology data then need to enable process control on a per substrate basis. Additionally when a process variation gives rise to variations of a characteristic across the substrate the context and/or metrology data need to be sufficiently densely distributed across the substrate. However the time available for metrology (measurements) is limited in view of the required throughput of the process. This limitation imposes that the metrology tool may measure only on selected substrates and selected locations across the substrate. The strategies to determine what substrates need to be measured are further described in the European patent applications, application number EP16195047.2 and EP16195049.8 which are incorporated herein by reference.

In practice it is often necessary to derive from a sparse set of measurement values relating to a process parameter (across a substrate or plurality of substrates) a denser map of values associated with the substrate(s). Typically such a dense map of measurement values may be derived from the sparse measurement data in conjunction with a model associated with an expected fingerprint of the process parameter. More information on modeling measurement data can be found in international Patent Application Publication No. WO 2013092106 which is incorporated herein by reference.

FIG. 4 is a schematic block diagram for a method 400 of forming a pattern feature on a substrate according to an embodiment of the present invention.

The method 400 comprises a step 410 of providing a radiation beam comprising a plurality of wavelength components. For example, the radiation beam may be the beam B output by the radiation source SO shown in FIG. 1 and described above.

In some embodiments, the radiation beam may be a pulsed radiation beam. For embodiments wherein the radiation beam is pulsed and comprises a plurality of wavelength components it will be appreciated that, as now discussed, this can be achieved in a plurality of different ways.

In some embodiments, each of the plurality of pulses may comprise a single wavelength component. The plurality of wavelength components may be achieved by a plurality of different sub-sets of pulses within the plurality of pulses, each sub-set comprising a different single wavelength component. For example, in one embodiment the radiation beam may comprise two sub-sets of pulses: a first sub-set comprising a single first wavelength component $\lambda_1$ and a second sub-set comprising a single second wavelength component $\lambda_2$, the first wavelength component $\lambda_1$ and the second wavelength component $\lambda_2$ being separated by wavelength difference $\Delta\lambda=\lambda_2-\lambda_1$. The pulses may alternate between pulses from the first and second sub-sets. That is, a pulse train (for example output by the radiation source SO) may comprise a pulse having the first wavelength $\lambda_1$ followed by a pulse having the second wavelength component $\lambda_2$ followed by a pulse having the first wavelength $\lambda_1$ and so on. Alternatively, each of the pulses may comprise a plurality of wavelength components.

In some embodiments, the plurality of wavelength components of the radiation beam may be discrete wavelength components. It will be appreciated that each of the plurality of wavelength components of the radiation beam will have some non-zero spread of wavelengths or bandwidth. However, for an arrangement wherein a wavelength difference $\Delta\lambda=\lambda_2-\lambda_1$ between two components is larger than the bandwidth of each of the wavelength components $\lambda_1$, $\lambda_2$, the two wavelength components may be considered to be discrete.

The method 400 further comprises a step 420 of forming an image of a patterning device on the substrate with the radiation beam using a projection system to form an intermediate pattern feature on the substrate. A plane of best focus of the image is dependent on a wavelength of the radiation beam. For example, as shown in FIG. 1 and described above, the radiation beam B may be incident on the patterning device (e.g. a mask) MA which is held on a mask support T. In this way, the radiation beam B is patterned by the pattern (design layout) present on patterning device MA. Having traversed the mask MA, the radiation beam B passes through the projection system PS, which focuses the beam onto a target portion C of the substrate W.

The method 400 further comprises a step 430 of controlling a spectrum of the radiation beam in dependence on one or more parameters of one or more subsequent processes applied to the substrate to form the pattern feature so as to control a dimension and/or position of the pattern feature. As used herein, the spectrum of the radiation beam is intended to mean an integrated or time averaged spectrum of the radiation beam over an exposure time as received by a point on the substrate W. For example, it will be appreciated that in order to form the first pattern feature on the substrate, the substrate may be provided with a photosensitive resist. Parts of the resist which receive a dose of radiation above a threshold value may undergo a change in properties. Therefore, by patterning the radiation beam B with a patterning device MA some parts of the resist can be delivered a dose of radiation which exceeds the threshold value whilst other parts of the substrate do not receive a dose of radiation which exceeds the threshold value. In order to deliver a dose of radiation which exceeds the threshold value parts of the substrate may be exposed to the patterned radiation beam for a sufficient exposure time. For a scanning exposure, the exposure time may be dependent on a scanning speed of the substrate and a spatial extent of the radiation beam in the scanning direction. For a pulsed radiation beam, the dose of radiation will, in general, be delivered as a plurality of pulses (for example or the order of 10 to 100 pulses or more). For such embodiments, as used here, the spectrum of the radiation beam is intended to mean an integrated or time averaged spectrum of the radiation beam over an exposure time as received by a point on the substrate W.

It will be appreciated that various different radiation sources SO may be operable to provide a radiation beam comprising a plurality of wavelength components and may be provided with an adjustment mechanism to allow a spectrum of said radiation beam to be adjustable. Examples of such radiation sources are disclosed in a US patent application published as US2020/0301286, which is incorporated herein by reference.

It will be appreciated that the method 400 is a lithographic method. The steps of providing the radiation beam 410 and forming the image of the patterning device 420 may be performed within a lithographic apparatus (for example of the type shown in FIGS. 1 to 3 and described above). The one or more subsequent processes applied to the substrate to form the pattern feature may comprise subsequent processing steps such as baking, developing, etching, annealing, deposition, doping and the like. Such processes may be applied within a lithographic cell LC of the type shown in FIG. 2 and described above (which the lithographic apparatus LA forms part of). In general, the formation of the pattern feature will be dependent both on exposure parameters within a lithographic apparatus LA and processing parameters outside of the lithographic apparatus LA.

The intermediate pattern feature may comprise a pattern formed by exposure of a substrate (for example coated with a layer of resist) in a lithographic apparatus, as now described with reference to FIGS. 5A to 5D.

FIG. 5A schematically depicts a substrate 500. The substrate may be, for example similar or identical to the substrate W described in relation to FIG. 1. FIG. 5B schematically depicts the provision of a first layer of material 502 on a surface of the substrate 500. The first layer of material 502 comprises a photoresist which undergoes some change in properties upon receipt of a dose of radiation exceeding a threshold value. The first layer of material 502 may be referred to as a sacrificial layer, since this layer will be sacrificed (removed) at a later stage during the process. Provision of the first layer of material 502 on the surface of the substrate 500 may be performed within a lithographic cell LC of the type shown in FIG. 2 and described above (for example using spin coaters SC). The first layer of material 502 is exposed to a beam of radiation (e.g. a patterned beam of radiation) in order to form intermediate pattern features in the first layer of material 502.

Parts of the first layer of material 502 which receive a dose of radiation above a threshold value undergo a change in properties. In particular, as shown schematically in FIG. 5C, after exposure to the patterned radiation beam, the first layer of material 502 may be considered to comprise a first set of parts 504 and a second set of parts 506, wherein one of the first and second set of parts 504, 506 has received a dose of radiation above the threshold value and wherein the other one of first and second set of parts 504, 506 has not received a dose of radiation above the threshold value. After exposure in the lithographic apparatus LA, the intermediate pattern feature (which may comprise the first set of parts 504 of the first layer of material 502) may be considered to be formed even before the second set of parts 506 of the first layer of material 502 have been removed. This is because properties of the first set of parts 504 of the first layer of material 502 differ from those of the second set of parts 506 of the first layer of material 502.

The first layer of material 502 is then developed. FIG. 5D shows the substrate 500 once the first layer of material 502 has been developed (and the second set of parts 506 of the first layer of material 502 have been removed). The first set of parts 504 of the first layer of material 502 provide intermediate pattern features 504 having sidewalls 508. The sidewalls 508 extend in a direction which is substantially perpendicular to the surface of the substrate 500.

In some embodiments, the method according to the first aspect may be a multiple patterning or spacer lithography process. For example, the method according to the first aspect may be a sidewall assisted double patterning (SADP) process or a sidewall assisted quadrupole patterning (SAQP) process. An example of an SADP process with now be briefly described with reference to FIGS. 6A to 6E.

Figure 6A:
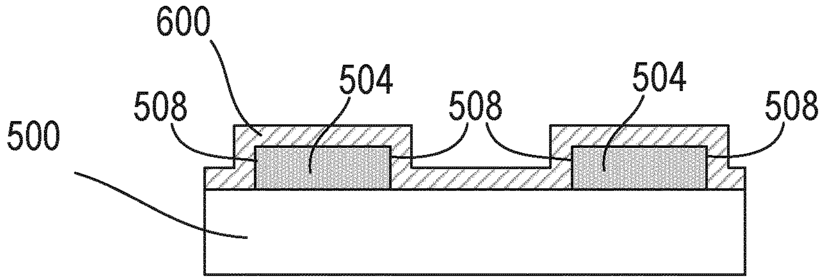
FIGS. 6A to 6E are schematic representations of a sidewall assisted double patterning (SADP) process using an intermediate pattern feature having sidewalls that are generally perpendicular to a plane of the substrate to form pattern features having half the pitch of the intermediate pattern features.

FIG. 6A shows a second layer of material 600 that has been provided over the intermediate pattern features 504 shown in FIG. 5D. The second layer of material 600 coats the sidewalls 508 of the intermediate pattern features 504. The second layer of material 600 may be referred to as a conformal layer, since the second layer of material 600 conforms to the shape of the intermediate pattern features 504.

Figure 6B:
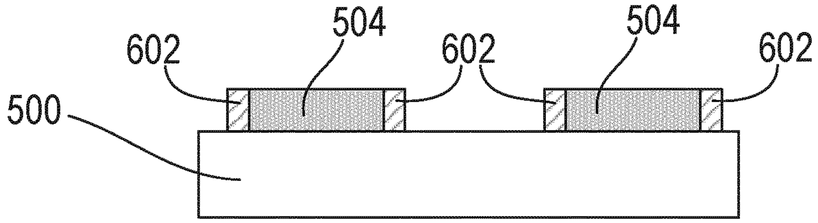

FIG. 6B shows that a portion of the second layer of material 600 has been removed, for example by etching or the like. A coating 602 of the second layer of material remains on (e.g. covering or coating) the sidewalls 508 of the intermediate pattern features 504. The coatings 602 of the second layer of material which remain on the sidewalls 508 of the intermediate pattern features 504 may be referred to as spacers, for example in the process that is currently being described—a spacer lithography process. Thus, it is understood that the term "spacer" is used, and may be used throughout this description, to describe the coating of a second layer of material on sidewalls 508 of the intermediate pattern features 504. The intermediate pattern features 504 are then removed, for example by etching or chemical processing or the like.

Figure 6C:
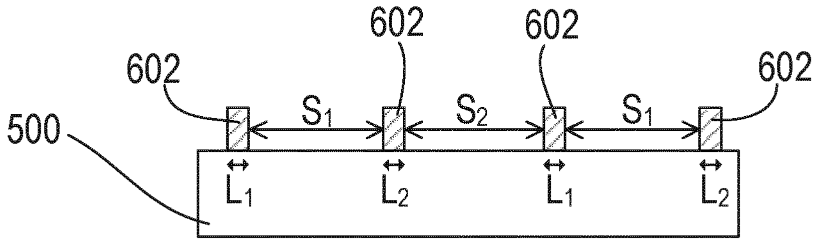

FIG. 6C shows that the intermediate pattern features have been removed. In removing the intermediate pattern features, left on the substrate 500 are at least parts of the second layer of material that formed the coatings 602 on sidewalls of the intermediate pattern features (that have now been removed). This material 602 thus now forms pattern features on the substrate 500 in locations that are adjacent to the locations of the sidewalls of the removed first pattern features. Hereinafter, the material 602 is referred to as pattern features 602. From a comparison of FIGS. 5D and 6C it can be seen that the pattern features 602 of FIG. 6C have half the pitch of the intermediate pattern features 504 of FIG. 5D. This halving in pitch has been achieved not by reducing the wavelength of the radiation used to provide such pattern features, but has instead been achieved by appropriate processing (e.g. the provision and removal of layers) before and after a single exposure.

Also shown in FIG. 6C are various spacings and widths: $S_1$ is a spacing between pattern features 602 that were formed on sidewalls either side of a intermediate pattern feature; $S_2$ is a spacing between pattern features 602 formed adjacent to sidewalls of adjacent and different intermediate pattern features; $L_1$ is the width (or in other words line width) of a pattern feature 602 formed adjacent to a first side wall of an intermediate pattern feature; $L_2$ is the width (or in other words line width) of a pattern feature 602 formed adjacent to a second, opposite side wall of the intermediate pattern feature.

In order to create uniformly structured and spaced pattern features it is desirable that $S_1$ is equal to $S_2$, and that $L_1$ is equal to $L_2$. As will be appreciated from a review of FIGS. 5A to 6C and the descriptions thereof, the spacing $S_1$ is primarily determined by the lithographic processes which are associated with the creation of the intermediate pattern feature 504 (see for example FIGS. 5B to 5D). The spacing $S_2$ is also determined by the lithographic processes which are associated with the creation of the intermediate pattern feature 504 (see for example FIGS. 5B to 5D), but also on the provision of the second layer of material 600 (shown in FIG. 6A) and the subsequent removal of a part of that second layer of material 600 (shown in FIG. 6B). The line widths $L_1$ and $L_2$ of the pattern features 602 are determined by the thickness of the second layer of material 600 that is provided (see for example FIG. 6A) and also on the subsequent removal of the part of the second layer of material 600 (see FIG. 6B). As will be appreciated, it is difficult to accurately and consistently control all of the processes which go into the determination of the spacings $S_1$ and $S_2$ and $L_1$ and $L_2$, meaning that it is consequentially difficult to ensure that the pattern features 602 are equally spaced and have equal widths.

Figure 6D:
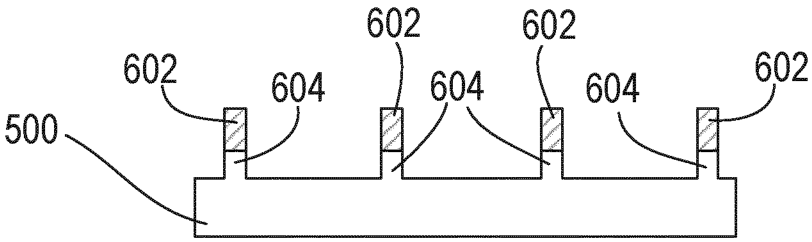
Figure 6E:
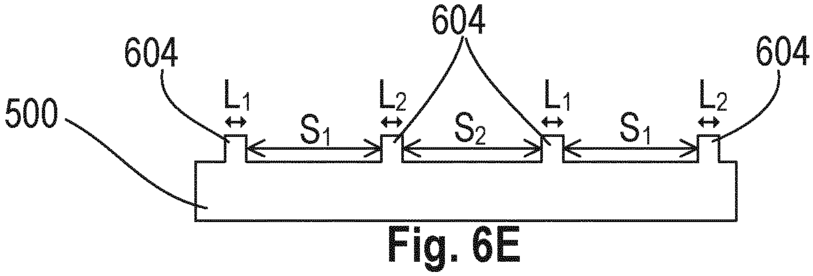
Figure 6F:
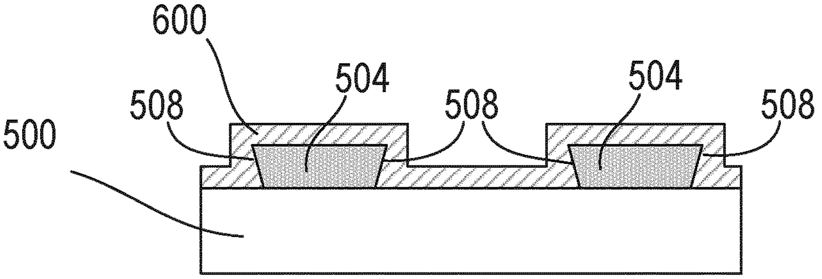
FIGS. 6F to 6J are schematic representations of the sidewall assisted double patterning (SADP) process shown in FIGS. 6A to 6E using an intermediate pattern feature having sidewalls that are at an oblique angle to a plane of the substrate.
Figure 6G:
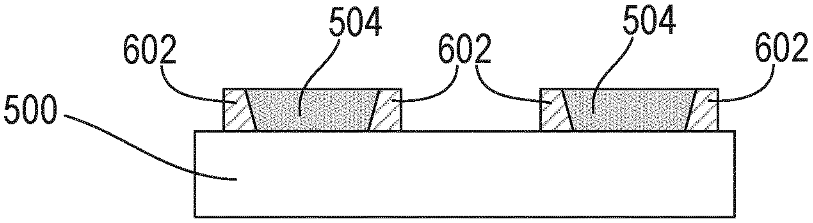

The process shown in FIGS. 6A to 6C may be continued. It is to be understood that the pattern features shown in FIG. 6C may be transferred to the substrate 500. FIG. 6D shows how regions of the substrate 500 which are not shielded by the pattern features 602 can be partially removed, for example by etching or the like. Regions shielded by the pattern features 602 form pattern features 604, which are formed from the same material as the substrate 500. The pattern features 602 formed from the second layer of material 600 are then removed, for example by etching or the like. FIG. 6E shows the substrate 500 when the pattern features formed from the second layer of material 600 have been removed.

With known spacer lithography processes, control over the dimensions and position of the patterning features 604 is predominantly achieved by control of the one or more subsequent processing steps (for example etching and deposition parameters).

Figure 7A:
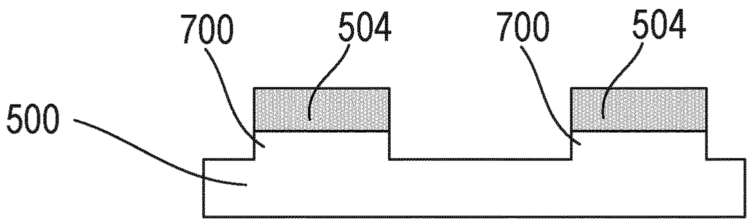
FIGS. 7A to 7B are schematic representations of a process using an intermediate pattern feature to form a pattern feature having substantially the same pitch.
Figure 7B:
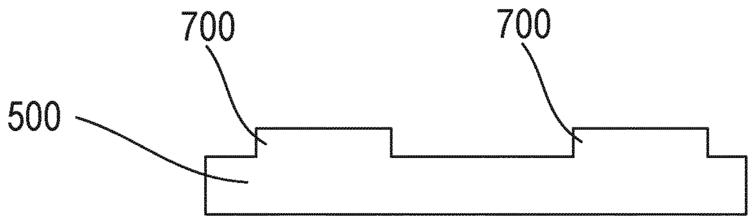

In some other embodiments, the pitch of the pattern features may have substantially the same pitch as the intermediate pattern features 504, as now discussed with reference to FIGS. 7A and 7B. In such embodiments, the formation of the pattern features may comprise development of the first layer of material 502 so as to selectively remove either regions 506 which have received the threshold dose of radiation or regions that have not received the threshold dose of radiation (see FIG. 5D). The pattern features 504 may be transferred to the substrate 500. FIG. 7A shows how regions of the substrate 500 which are not shielded by the pattern features 504 can be partially removed, for example by etching or the like. Regions shielded by the pattern features 504 form pattern features 700, which are formed from the same material as the substrate 500. The pattern features 504 formed from the first layer of material 502 are then removed, for example by etching or the like. FIG. 7B shows the substrate 500 when the pattern features 504 formed from the first layer of material 502 have been removed.

A lithographic exposure method (such as, for example, the method 400 shown in FIG. 4 and described above) that uses a radiation beam comprising a plurality of discrete wavelength components is known as a multi focal imaging (MFI) process. Such arrangements have been used to increase a depth of focus of an image formed by a lithographic apparatus.

Advantageously, the method 400 shown in FIG. 4 and described above uses control of the spectrum of the radiation beam to provide control over a dimension and/or position of a pattern feature 604, 700 formed on a substrate 500. The method 400 shown in FIG. 4 exploits the fact that optical aberrations of the projection system PS are, in general, wavelength dependent. Therefore, each of the plurality of wavelength components of the radiation beam will be subject to different optical aberrations and, in turn, characteristics of the contribution to the image from each of the plurality of wavelength components will, in general, be different.

As used herein, optical aberrations (also referred to herein as aberrations) of a projection system PS may represent distortions of a wavefront of the radiation beam approaching a point in an image plane of the projection system from a spherical wavefront.

In general, the projection system PS has an optical transfer function, which may be non-uniform and which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be obtained from a measured scalar map by calculating the inner product of the measured scalar map with each Zernike polynomial in turn and dividing this by the square of the norm of that Zernike polynomial. In the following, unless stated otherwise, any reference to Zernike coefficients will be understood to mean the Zernike coefficients of a relative phase map (also referred to herein as an aberration map). It will be appreciated that in alternative examples other sets of basis functions may be used. For example, some examples may use Tatian Zernike polynomials, for example for obscured aperture systems.

The wavefront aberration map represents the distortions of the wavefront of light approaching a point in an image plane of the projection system PS from a spherical wavefront (as a function of position in the pupil plane or, alternatively, the angle at which radiation approaches the image plane of the projection system PS). As discussed, this wavefront aberration map W(x, y) may be expressed as a linear combination of Zernike polynomials:

$$W(x, y) = \sum_n c_n \cdot Z_n(x, y) \tag{1}$$

where x and y are coordinates in the pupil plane, $Z_n(x, y)$ is the nth Zernike polynomial and $c_n$ is a coefficient. It will be appreciated that in the following, Zernike polynomials and coefficients are labelled with an index which is commonly referred to as a Noll index. Therefore, $Z_n$ (x, y) is the Zernike polynomial having a Noll index of n and $c_n$ is a coefficient having a Noll index of n. The wavefront aberration map may then be characterized by the set of coefficients $c_n$ in such an expansion, which may be referred to as Zernike coefficients.

It will be appreciated that, in general, only a finite number of Zernike orders are taken into account. Different Zernike coefficients of the phase map may provide information about different forms of aberration which are caused by the projection system PS. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may be irrelevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration which are caused by the projection system (e.g. astigmatism, coma, spherical aberrations and other effects).

Throughout this description the term "aberrations" should be intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more. Furthermore, any reference to an aberration map for a projection system may include all forms of deviation of a wavefront from a perfect spherical wavefront, including those due to image placement.

The relative phase of the projection system PS in its pupil plane may be determined by projecting radiation from an object plane of the projection system PS (i.e. the plane of the patterning device MA), through the projection system PS and using a shearing interferometer to measure a wavefront (i.e. a locus of points with the same phase). The shearing interferometer may comprise a diffraction grating, for example a two dimensional diffraction grating, in an image plane of the projection system (i.e. the substrate table WT) and a detector arranged to detect an interference pattern in a plane that is conjugate to a pupil plane of the projection system PS.

The projection system PS comprises a plurality of optical elements (including lenses). The projection system PS may include a number of lenses (e.g. one, two, six or eight lenses). The lithographic apparatus LA further comprises adjusting means PA for adjusting these optical elements so as to correct for aberrations (any type of phase variation across the pupil plane throughout the field). To achieve this, the adjusting means PA may be operable to manipulate optical elements within the projection system PS in one or more different ways. The projection system may have a co-ordinate system wherein its optical axis extends in the z direction (it will be appreciated that the direction of this z axis changes along the optical path through the projection system, for example at each lens or optical element). The adjusting means PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric optical elements. Deformation of an optical element may be performed for example by using actuators to exert force on sides of the optical element and/or by using heating elements to heat selected regions of the optical element. The adjusting means PA of the lithographic apparatus LA may implement any suitable lens model so as to control optical aberrations via adjustments to the optical elements of the projection system PS.

In some examples, the adjusting means PA may be operable to move the support structure MT and/or the substrate table WT. The adjusting means PA may be operable to displace (in any of the x, y, z directions or a combination thereof) and/or tilt (by rotating about axes in the x or y directions) the support structure MT and/or the substrate table WT.

A projection system PS which forms part of a lithographic apparatus may periodically undergo a calibration process. For example, when a lithographic apparatus is manufactured in a factory the optical elements (e.g. lenses) which form the projection system PS may be set up by performing an initial calibration process. After installation of a lithographic apparatus at a site at which the lithographic apparatus is to be used, the projection system PS may once again be calibrated. Further calibrations of the projection system PS may be performed at regular intervals. For example, under normal use the projections system PS may be calibrated every few months (e.g. every three months).

Calibrating a projection system PS may comprise passing radiation through the projection system PS and measuring the resultant projected radiation. Measurements of the projected radiation may be used to determine aberrations in the projected radiation which are caused by the projection system PS. Aberrations which are caused by the projection system PS may be determined using a measurement system. In response to the determined aberrations, the optical elements which form the projection system PS may be adjusted so as to correct for the aberrations which are caused by the projection system PS.

An example of a characteristic of the contribution to the image from each of the plurality of wavelength components that may be different for each spectral component is a plane of best focus of that contribution. Therefore, as will be discussed below with reference to FIGS. 8A to 8F, 10 and 11, in some embodiments, the method 400 exploits the fact that different spectral components will, in general, be focused at different planes within or proximate to the substrate 500. This is because optical aberrations which contribute to a defocus of the image (such as, for example, the fourth Zernike coefficient) are different for each of the plurality of wavelength components. Therefore, doses of radiation provided by the different spectral components will be deposited in different regions of the substrate 500, said regions generally centered on a plane of best focus of that spectral component. Therefore, by controlling the spectrum of the radiation beam the planes of best focus for each spectral component and/or a dose of radiation delivered by each spectral component may be controlled. In turn, this provides control over the position and dimensions of the intermediate pattern features 504, which in turn can provide control over the position and dimensions of the pattern features 604, 700. In addition, as now discussed, control over the spectrum of the radiation beam provides control over a shape of the intermediate pattern features 504, in particular sidewall parameters (for example angle and linearity) of the intermediate pattern feature, which in turn can provide control over the position and dimensions of the pattern features.

As will be described further below, with reference to FIGS. 8A to 8F, the method 400 shown in FIG. 4 and described above can provide control over a sidewall angle of a feature 504 formed from a lithographic exposure process. As now explained with reference to FIGS. 6F to 6J, such control over sidewall angle of a feature 504 formed from a lithographic exposure process can provide some control over dimensions of coatings 602 of a second layer of material which remain on the sidewalls 508 of these features. In turn, this provides some control over pattern features 604 which are formed from the same material as the substrate 500 (using the coatings 602 as a mask, for example, in an etching process). FIGS. 6F to 6J correspond to FIGS. 6A to 6E respectively. Whilst FIGS. 6A to 6E show a feature 504 formed from a lithographic exposure process having sidewalls that are generally perpendicular to a plane of the substrate 500, FIGS. 6F to 6J show a feature 504 formed from a lithographic exposure process having sidewalls that are at an oblique angle to a plane of the substrate 500.

Figure 6H:
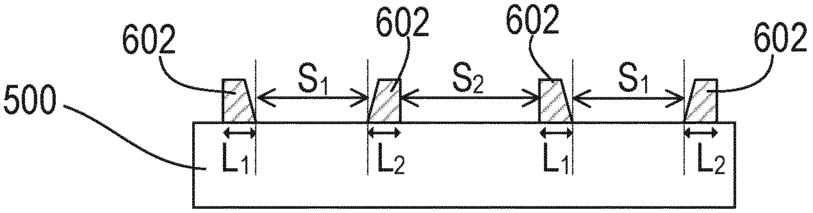
Figure 6I:
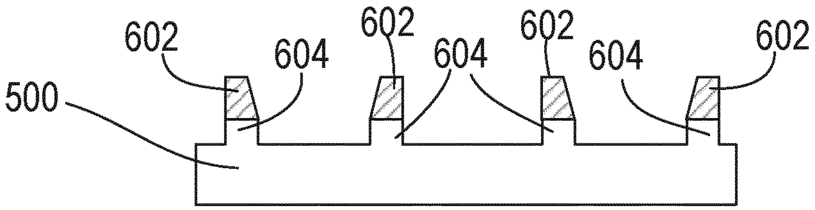
Figure 6J:
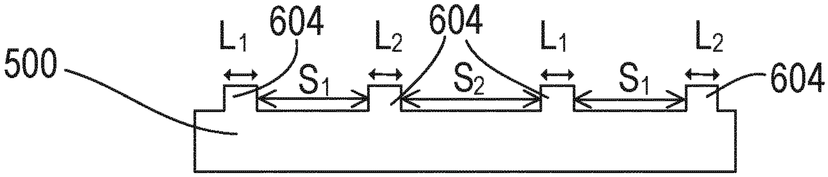

It can be seen from a comparison of FIGS. 6H and 6C that control over the sidewall angle of an intermediate feature 504 can provide control over: the spacing $S_1$ between pattern features 602 that were formed on sidewalls either side of an intermediate pattern feature; the width $L_1$ of a pattern feature 602 formed adjacent to a first side wall of an intermediate pattern feature; and the width $L_2$ of a pattern feature 602 formed adjacent to a second, opposite side wall of the intermediate pattern feature. It can be seen from a comparison of FIGS. 6I and 6D and a comparison of FIGS. 6J and 6E that, in turn, this provides control over the corresponding spacings and widths of the pattern features 604 transferred to the substrate 500. Such control may facilitate the creation of uniformly structured and spaced pattern features.

The method 400 shown in FIG. 4 may further comprise applying one or more subsequent processes to the substrate to form the pattern feature on the substrate. Said one or more subsequent processes may comprise one or more of the processes described above with reference to FIGS. 6A to 7B.

From FIGS. 6D and 7A, it can be seen that regions of the substrate 500 which are not shielded by the pattern features 602, 504 can be partially removed, for example by etching or the like. In particular, it is the positions and/or dimensions of a portion of the features 602, 504 that contacts the substrate 500 (which may be referred to as a base portion of the features 602, 504) which determine the positions and dimensions of the features 604, 700, which are formed from the same material as the substrate 500. Furthermore, the positions and/or dimensions of the base portions of the features 602, 504 are dependent on a sidewall angle of said pattern features 604, 700.

Conventionally, during exposure of a resist coated wafer it is desirable to keep the resist at or close to a plane of best focus of the lithographic apparatus LA. In practice, a resist coated wafer when clamped on a substrate support (for example a wafer table WT as shown in FIG. 1) is not perfectly flat. Therefore, it is known to determine a topology of the resist coated wafer before exposure to the radiation beam using a level sensor or the like. The determined topology of the clamped substrate may be used during exposure of the substrate to the radiation beam to keep the substrate at or close to a total or overall plane of best focus (for example by moving the wafer table WT in a direction generally perpendicular to a plane of the substrate).

Figures 8A, 8B, 8C, 8D, 8E, 8F:
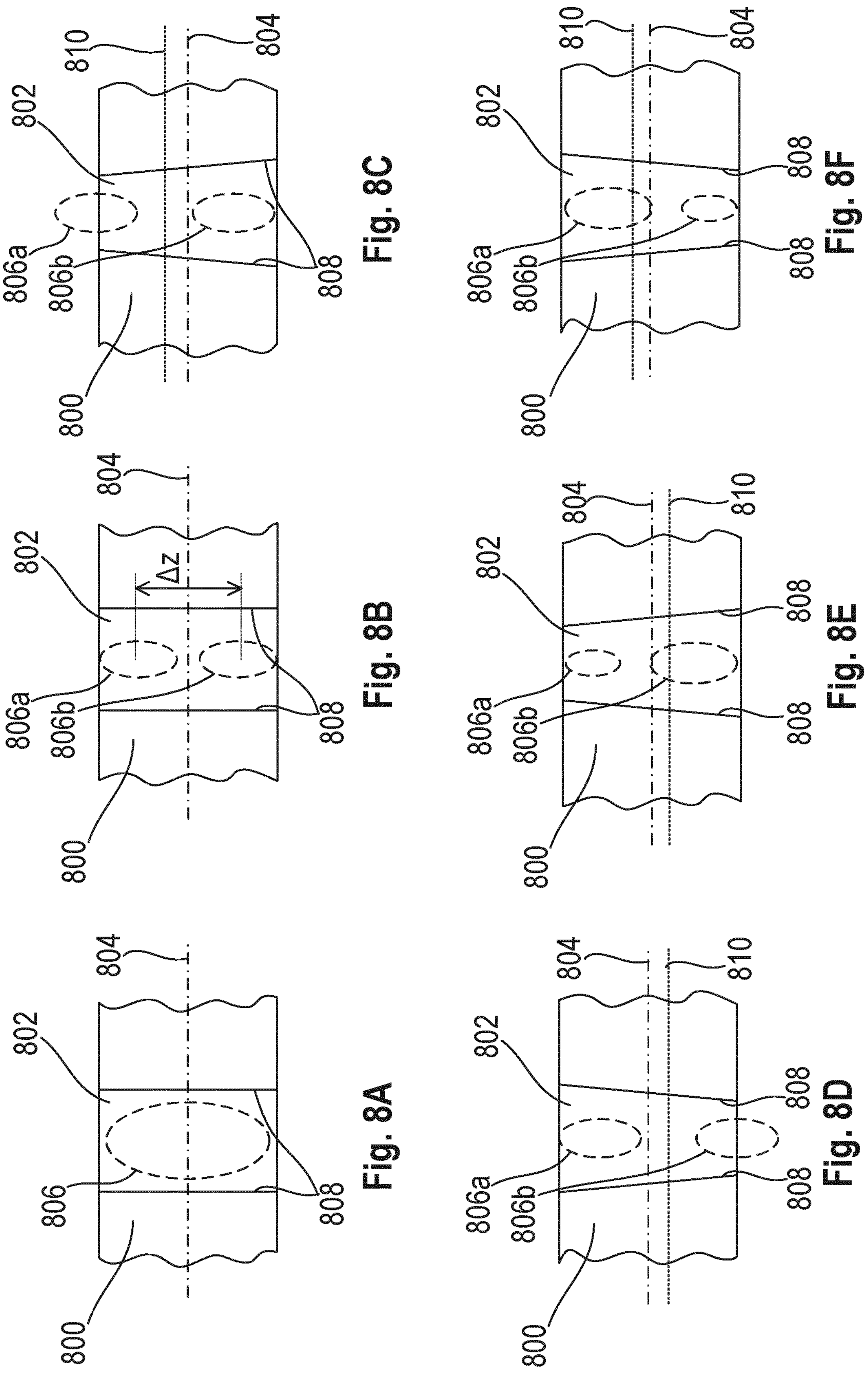
FIG. 8A is a schematic representation of a part of a layer of resist, and a feature that is being formed in the layer of resist by exposing that feature to a dose of radiation.
FIG. 8B is a schematic representation of a part of a layer of resist and a feature being formed on the layer of resist using a multi focal imaging process wherein a dose of radiation is delivered to the feature using two discrete wavelength components.
FIGS. 8C to 8F are is a schematic representations of a part of a layer of resist and a feature being formed on the layer of resist using a multi focal imaging process of the type shown in FIG. 8B and wherein a spectrum of the radiation is controlled in order to control the shape and position of the sidewalls of said feature.

FIG. 8A is a schematic representation of a part of a layer of resist 800 (which may, for example, correspond to the first layer of material 502 provided on the surface of the substrate 500 shown in FIG. 5B). Also shown is a feature 802 that is being formed in the layer of resist 800 by exposing that feature to a dose of radiation. The radiation is an image of a patterning device that has been focused to a plane of best focus 804. Also shown is a schematic representation of the dose of radiation 806 delivered to the resist 800. In the arrangement shown in FIG. 8A, the dose of radiation 806 is symmetric about the plane of best focus 804 and the plane of best focus 804 is centered on the layer of resist 800 (in a direction generally perpendicular to the layer of resist 800). With such an arrangement, for a sufficiently small thickness of the layer of resist 800 sidewalls 808 of the feature 802 are generally perpendicular to the layer of resist 800. This may be the case for relatively thin layers of resist (for example having a thickness of the order of 100 nm or less). However, it will be appreciated that for thicker layers of resist, in general, the sidewalls 808 of the feature 802 may deviate from being generally perpendicular to the layer of resist 800 (since an extent of the aerial image and therefore the region which receives the dose of radiation may be significantly smaller than a thickness of the layer of resist 800).

Previously, control over the sidewall angle of spacer features 504 has been proposed by controlling the focus of an image while forming the spacer feature 504. That is, it has previously been proposed to move the substrate such that the plane of best focus 804 is not centered on the layer of resist 800 (in a direction generally perpendicular to the layer of resist 800) in order to change the angle of the sidewalls.

However, such an arrangement can only provide control at the expense of imaging performance and contrast. Furthermore, focus of an image within a lithographic exposure process is controlled by controlling a position (for example height) of the substrate (for example using a wafer stage WT that supports the substrate). Such control is therefore limited to a range of achievable accelerations of the wafer stage WT.

In contrast, the method 400 shown in FIG. 4 and described above allows for higher spatial frequency corrections to be applied, as now discussed. In contrast to previous methods, which control a height of the substrate using a wafer stage WT that supports the substrate, the method according to the first aspect controls a spectrum of the radiation beam. The spectrum of the radiation beam can be controlled on a time scale that is significantly less than an exposure time of the substrate. For example, the radiation beam may be a pulsed radiation beam and the spectrum of the radiation beam may be controlled pulse to pulse (and the exposure may last for tens or hundreds of pulses). Therefore, the method according to the first aspect (which is not limited by a range of achievable accelerations of a wafer stage) allows for higher spatial frequency corrections to be applied than with previous methods. This can be used, for example, to control placement of the pattern feature (i.e. overlay) at relatively high spatial frequency. This may have application, for example, for overlay control due to the presence of intra-die stress for dynamic random access memory (DRAM) and three-dimensional NAND (3DNAND) flash memory processes.

FIG. 8B is another schematic representation of a part of a layer of resist 800 which differs from FIG. 8A in that it represents a multi focal imaging (MFI) process wherein the dose of radiation is delivered to the feature 802 using two discrete wavelength components. Also shown is a schematic representation of the two doses of radiation 806*a*, 806*b* delivered to the resist 800 by the two different wavelength components. The two doses of radiation 806*a*, 806*b* delivered to the resist 800 by the two different wavelength components are substantially equal (each delivering half the total dose). Since the aberrations of the projection system PS are, in general, wavelength dependent (known as chromatic aberrations) the two doses 806*a*, 806*b* of radiation are delivered to different regions of the resist 800, the regions separated be an offset $\Delta z$ (which is dependent on a wavelength difference $\Delta\lambda$ between the two wavelength components).

The plane of best focus 804 is at a position between the individual planes of best focus for the two an average wavelength components as determined by the doses 806*a*, 806*b* of the wavelength components. In this example, the two doses of radiation 806*a*, 806*b* delivered to the resist 800 by the two different wavelength components are substantially equal and so the plane of best focus 804 is midway between the individual planes of best focus for the two an average wavelength components. In the arrangement shown in FIG. 8B the plane of best focus 804 is centered on the layer of resist 800 (in a direction generally perpendicular to the layer of resist 800). With such an arrangement, sidewalls 808 of the feature 802 are generally perpendicular to the layer of resist 800.

As explained above, during exposure of a resist coated wafer it is desirable to keep the resist at or close to a plane of best focus of the lithographic apparatus LA. This is achieved in FIGS. 8A and 8B by maintaining a position of the layer of resist 800 such that the plane of best focus 804 is centered on the layer of resist 800.

Previously, control over the sidewall angle of spacer features has been proposed by controlling the focus of an image while forming the spacer feature. That is, it has previously been proposed to move the substrate such that the plane of best focus 804 is not centered on the layer of resist 800 (in a direction generally perpendicular to the layer of resist 800) in order to change the angle of the sidewalls. That is, the substrate is moved to bring the resist 802 out of focus to control the sidewall angles.

As will be discussed further below with reference to FIGS. 8C to 8F, in embodiments of the present invention, in order to control the shape and position of the sidewalls 808 of features 802 it is proposed not to move the substrate relative to the image formed by the projection system PS. Rather, it is proposed that the substrate should be maintained (dynamically, according to the topography of the substrate) to maintain the plane of best focus 804 for a nominal spectrum of the radiation beam such that it is centered on the layer of resist 800. However, it is proposed to modify the spectrum of the radiation such that the plane of best focus of the radiation moves (relative to the plane of best focus 804 for a nominal spectrum of the radiation beam). In this way, some control of the spectrum of the radiation beam can be used for fast, high frequency fine control in addition to the coarse control provided by the movement of the wafer stage WT.

Advantageously, the method 400 shown in FIG. 4 allows a sidewall parameter of the intermediate pattern feature formed on the substrate to be controlled by controlling the spectrum of the radiation beam. In particular, this control is in dependence on one or more parameters of the one or more subsequent processes applied to the substrate to form the pattern feature on the substrate. This allows, for example, for any errors in the pattern feature on the substrate arising from the one or more subsequent processes applied to the substrate to be corrected for by controlling multi focal imaging parameters.

As shown schematically in FIGS. 8C and 8D, in some embodiments controlling the spectrum of the radiation beam may comprise controlling a wavelength of at least one of the plurality of wavelength components.

FIGS. 8C and 8D both show arrangements wherein the wavelengths of both of the two wavelength components have been adjusted (or shifted) relative to nominal values the wavelengths of the two wavelength components (which are shown in FIG. 8B). By shifting the wavelengths of the wavelength components a plane of best focus of each of the wavelength components is also shifted. As a result, in both cases the plane of best focus 810 is shifted relative to the plane of best focus 804 for the nominal spectrum of the radiation beam. In turn, this allows control over the positions (within the substrate) to which the doses 806*a*, 806*b* of the wavelength components are delivered, providing control over the sidewall angles. In both of the arrangements shown in FIGS. 8C and 8D, the wavelength of one of the two wavelength components has been adjusted relative to a nominal value such that part of the dose (806*a* in FIGS. 8C and 806*b* in FIG. 8D) of that wavelength component is delivered to a region outside of the layer of resist. As such, this part of the dose of radiation does not participate in the exposure of the layer of resist 800.

As shown schematically in FIGS. 8E and 8F, in some embodiments controlling the spectrum of the radiation beam may comprise controlling a dose 806*a*, 806*b* of at least one of the wavelength components. FIGS. 8E and 8F show arrangements wherein the doses 806*a*, 806*b* of both of the two wavelength components have been adjusted. In particular, the dose 806*a* of one of the wavelength components has been reduced and the dose 806*b* of the other wavelength component has been increased. The total dose may be maintained at a fixed target value.

It will be appreciated that a total dose of radiation delivered to any part of the substrate may be controlled (for example as part of a feedback loop controlling a power of a radiation source that produces the plurality of pulses). However, independent of such overall or total dose control, the relative doses of the plurality of wavelength components can be controlled. For example, the doses of the plurality of discrete wavelength components can be controlled by controlling the relative intensities of the plurality of discrete wavelength components. Additionally or alternatively, the dose can be controlled by controlling the number of pulses containing each of the plurality of discrete wavelength components.

As previously mentioned, the method 400 of FIG. 4 may further comprise controlling an overall focus of the radiation beam independently of the spectrum of the radiation beam. That is, the wafer stage WT may be used to maintain the plane of best focus 804 for the nominal spectrum of the radiation beam at a desired position within the layer of the resist 800 (for example centered on the layer of resist 800).

The spectrum of the radiation beam and the focus of the radiation beam may be co-optimized.

Furthermore, the method 400 of FIG. 4 may further comprise controlling a total dose independently of the spectrum of the radiation beam. The total dose of radiation may be controlled to provide control over a critical dimension of the intermediate pattern feature. The spectrum of the radiation beam and the total dose may be co-optimized.

As explained above with reference to FIGS. 8A to 8F, controlling the spectrum of the radiation beam can provide control over a sidewall angle of the sidewalls of an intermediate pattern feature 802. It will be appreciated from FIGS. 5A to 6E that, in turn, this can affect a dimension of the coating 602 of the second layer of material on the sidewalls of the intermediate pattern feature.

Figure 10:
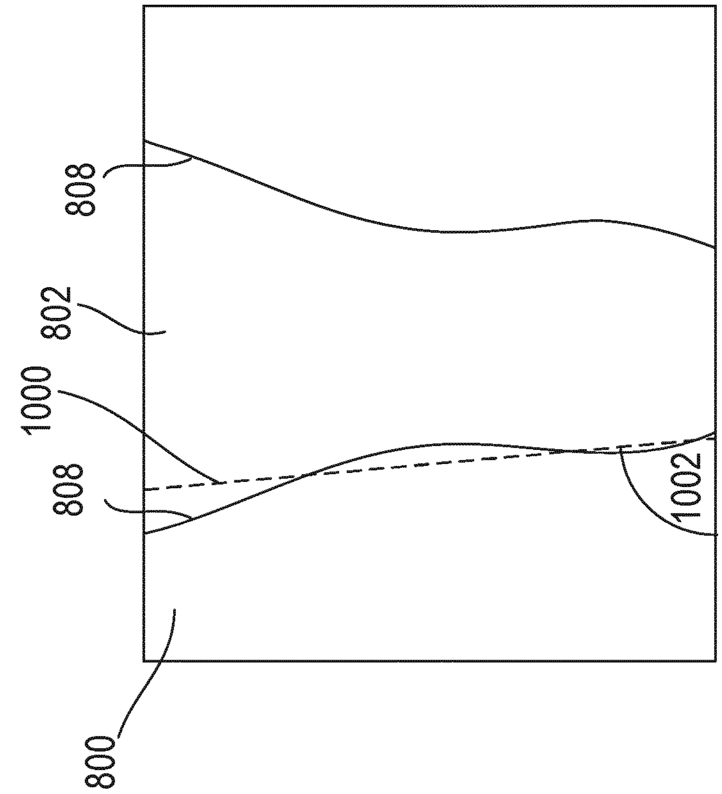
FIG. 10 is a schematic representation of a part of a layer of resist with a feature that is generally of the form of the feature shown in FIG. 8D formed in the layer of resist but wherein the feature does not have straight sidewalls.

It will be appreciated in practice features formed in layer of resist will, in general, not have straight side walls. FIG. 10 is a schematic representation of a part of a layer of resist 800 with a feature 802 that generally of the form of the feature shown in FIG. 8D formed in the layer of resist 800. The feature 802 shown in FIG. 10 does not have straight sidewalls 808. For such arrangements, the shape of the sidewalls may be defined with reference to a linear fit 1000 to the sidewall 808 (for example a least squared fit). Two useful parameters are the sidewall angle and the sidewall linearity. The sidewall angle is defined as the angle 1002 formed between the linear fit 1000 to the sidewall 808 and a plane of the layer of resist 800. The sidewall linearity may be defined as the maximum deviation from the linear fit of the sidewall profile. Simulations have shown that both the sidewall angle and the sidewall linearity can be controlled with using the method 400 shown in FIG. 4 and described above.

Advantageously, the control of the spectrum of a radiation beam comprising a plurality of wavelength components (as used by the method 400 of FIG. 4) offers an orthogonal control parameter (or control knob) to that of the focus control provided by movement of a wafer stage WT. Therefore, this spectral control can be implemented independently of such focus control (and co-optimized with such focus control).

It has been found that for imaging with a krypton fluoride (KrF) excimer laser (with a wavelength of 248 nm), such control of the spectrum of a radiation beam comprising a plurality of wavelength components (as used by the method 400 of FIG. 4) does not significantly reduce image contrast.

Figure 11:
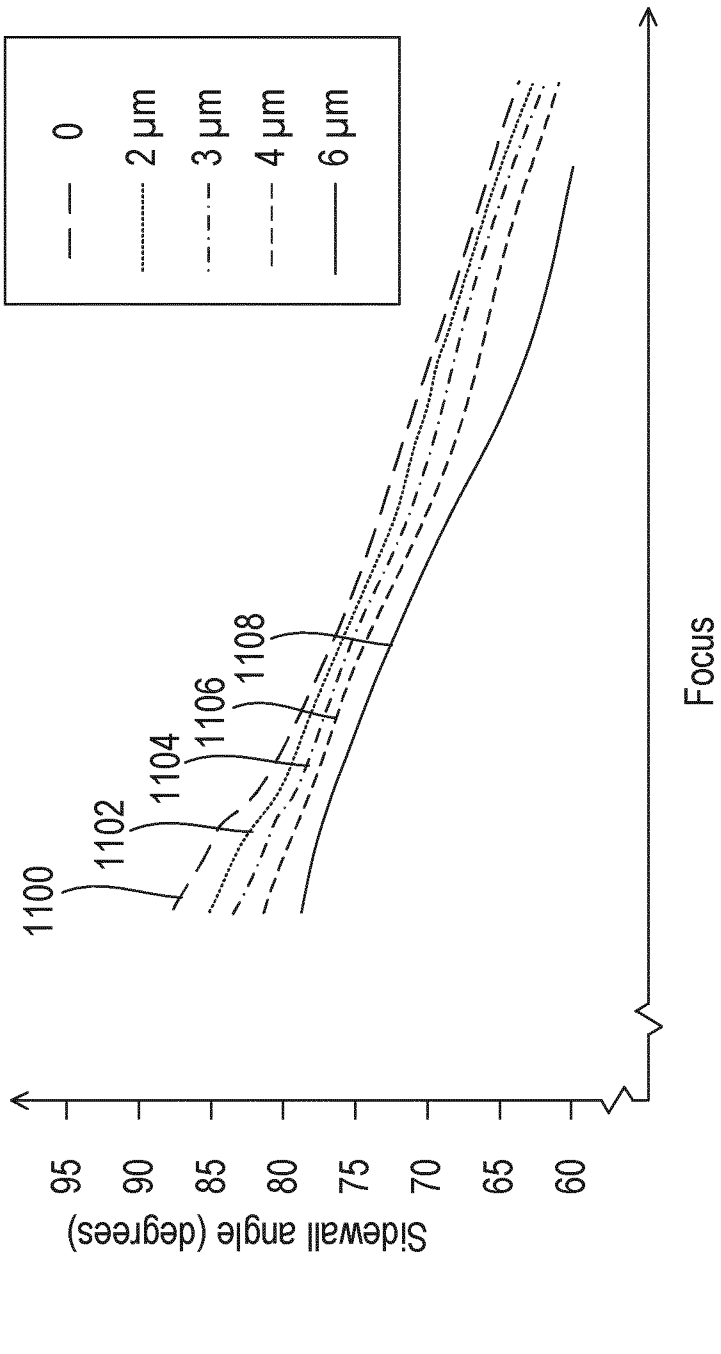
FIG. 11 shows five different plots of sidewall angle as a function of a focus control parameter, each of the different plots representing a different peak separation Δz between the planes of best focus of the different wavelength components of the radiation beam.

Via spectral control, multi-focal imaging may provide control over sidewall angle within a relatively large range. FIG. 11 shows five different plots 1100, 1102, 1104, 1106, 1108 of sidewall angle as a function of a focus control parameter. Each of the different plots 1100, 1102, 1104, 1106, 1108 represents a different peak separation Δz between the planes of best focus of the different wavelength components of the radiation beam (as depicted schematically in FIG. 8B). The plots 1100, 1102, 1104, 1106, 1108 represents a different peak separations Δz of 0 μm, 2 μm, 3 μm, 4 μm and 6 μm respectively. From FIG. 11, it can be seen that a range of the order of 10° may be provided using MFI KrF imaging. The range of control over sidewall angle is dependent on the illumination mode (for example on the pupil fill, G) and numerical aperture (NA) settings.

For imaging with argon fluoride (ArF) excimer laser (with a wavelength of 193 nm) some imaging contrast loss may be expected although this may be corrected for using source-mask optimization (SMO). For immersion argon fluoride (ArFi) lithography, a smaller range of peak separations Δz between the planes of best focus of the different wavelength components of the radiation beam is available. Therefore, it may be desirable to use a thinner resist process to still achieve sidewall angle control using such smaller peak separations Δz between the planes of best focus of the different wavelength components of the radiation beam. This should be achievable subject to suitable process optimization.

For one specific process, it has been found that for ArFi lithography a peak separation Δz between the planes of best focus of the different wavelength components of the radiation beam of around 65 nm can be achieved whilst still maintaining acceptable imaging performance (as evaluated, for example, by contrast and/or normalized image log slope). A current typical ArFi resist process thickness is in the range 70-90 nm. Therefore, it is expected that the method 400 shown in FIG. 4 and described above should provide adequate sidewall angle control for an ArFi lithographic process.

Another example of a characteristic of the contribution to the image from each of the plurality of wavelength components that may be different for each spectral component is a position of the image in a plane of the image. Therefore, in some embodiments, as now described with reference to FIGS. 12A to 15B, the method 400 shown in FIG. 4 exploits the fact that different spectral components will, in general, be focused at different positions in a plane of the substrate. This may be because aberrations that contribute to the position of the image (such as, for example, the second and third Zernike coefficients) are different for each of the plurality of wavelength components. Therefore, contributions to the image provided by the different spectral components will be deposited in different positions on the substrate. Therefore, by controlling the spectrum of the radiation beam the position of each spectral component and/or a dose of radiation delivered by each spectral component may be controlled. In turn, this provides control over the position the intermediate pattern features, which in turn can provide control over the position of the pattern features.

Typically, the alignment of a substrate with an image formed by the projection system within a lithographic exposure process is controlled by controlling a position (in a plane of the substrate) of the substrate (for example using a wafer stage that supports the substrate) and/or by control over aberrations of the projection system PS. Again, such movements of the substrate are limited to a range of achievable accelerations of the wafer stage. Furthermore, there is a limit to how quickly the adjusting means PA of the lithographic apparatus LA can be used to control the aberrations of the projection system PS. In contrast to such previous methods, the method according to the first aspect controls a spectrum of the radiation beam. Again, the spectrum of the radiation beam can be controlled on a time scale that is significantly less than an exposure time of the substrate. For example, the radiation beam may be a pulsed radiation beam and the spectrum of the radiation beam may be controlled pulse to pulse (and the exposure may last for tens or hundreds of pulses). Therefore, the method according to the first aspect (which is not limited by a range of achievable accelerations of a wafer stage or speed of response of the adjusting means PA of the lithographic apparatus LA) allows for higher spatial frequency corrections to be applied than with previous methods. This can be used, for example, to control placement of the pattern feature (i.e. overlay) at relatively high spatial frequency. This may have application, for example, for overlay control due to the presence of intra-field stress. Examples of lithographic processes that suffer from overlay due to the presence of intra-field stress include processes wherein the field contains both areas that contain a high density of features and areas that contain a low density of (or no) features. Examples of lithographic processes that suffer from overlay due to the presence of intra-field stress include: dynamic random access memory (DRAM), three-dimensional NAND (3DNAND) flash memory processes, and processes wherein the same die is imaged multiple times in a single field (for example with a scribe line between each die).

As explained above, the illuminator IL of a lithographic apparatus (see FIG. 1) is arranged to form a generally rectangular band of radiation on the patterning device MA. This band of radiation may be referred to as an exposure slit (or slit).

The relative phase map referred to above (which may be expressed as a linear combination of different Zernike polynomials) are, in general, field and system dependent. That is, in general, each projection system PS will have a different Zernike expansion for each field point (i.e. for each spatial location in its image plane). Therefore, in general, the Zernike expansion is dependent upon a position in the exposure slit (since each position in the slit receives radiation that experiences a different part of the projection system PS). For a scanning exposure, each point on the substrate W may receive radiation from a single non-scanning position in the slit (and will receive radiation from all such positions in the scanning direction, which will be averaged by the scanning exposure). Therefore, for a scanning exposure the Zernike expansion is, in particular, dependent upon a position in the exposure slit in the non-scanning direction. Therefore, in general, the coefficient of the nth Zernike polynomial c n varies across the slit and in particular is a function of the non-scanning direction, x.

In general, it may be desirable to use the adjusting means PA of the lithographic apparatus LA to ensure that there are no optical aberrations (any type of phase variation across the pupil plane throughout the field) so as to optimize the image formed on the substrate W. However, since, in general, the coefficients of the Zernike polynomials vary across the slit (in particular in the non-scanning direction, x) in practice the adjusting means PA of the lithographic apparatus LA may be used to ensure that the optical aberrations at all positions in the slit are at acceptable levels.

In addition to being dependent on the position within the slit, the optical aberrations are dependent on wavelength (and are known as chromatic aberrations). Therefore, at each point in the slit, the coefficient of the nth Zernike polynomial $c_n$ for a general wavelength $\lambda$ is given by the sum of a set-point contribution at a nominal or setpoint wavelength and a contribution from a deviation of the wavelength from the nominal or setpoint wavelength:

$$c_n = c_{\lambda_0,n} + \frac{\partial c_n}{\partial \lambda}(\lambda - \lambda_0) \qquad (2)$$

where $\lambda_0$ is the nominal or setpoint wavelength and $c_{\lambda_0,n}$ is the coefficient of the nth Zernike polynomial at the nominal or setpoint wavelength.

As now described with reference to FIGS. 12A to 15B, in some embodiments of the method 400 shown in FIG. 4, a multi focal imaging (MFI) process is used wherein the wavelengths of the plurality of wavelength components of the radiation beam are controlled, in combination with the adjusting means PA of the lithographic apparatus LA, to provide control over placement of pattern features on the substrate. In particular, the control of the wavelengths of the plurality of wavelength components of the radiation beam, in combination with the adjusting means PA, are used to correct for stress-driven intra-field placement errors.

As explained above with reference to FIGS. 8A-8F, in a multi focal imaging process a dose of radiation is delivered to the substrate using two (or more) discrete wavelength components. Each wavelength component delivers a dose of radiation. Since the aberrations of the projection system PS are wavelength dependent, the doses from the different wavelength components are delivered to different regions of the substrate, the regions separated by an offset $\Delta z$ (which is dependent on a wavelength difference $\Delta\lambda$ between the two wavelength components).

The projection system PS is designed (and optimized) for radiation at a single nominal wavelength, $\lambda_0$. Radiation at different wavelengths will experience different aberrations that the projection system PS is not optimized for. The coefficient of the nth Zernike polynomial $c_n$ for a general wavelength $\lambda$ that differs from the nominal wavelength can be calculated from the corresponding Zernike coefficient $c_{\lambda_0,n}$ for the coefficient of the nth Zernike polynomial at the nominal or setpoint wavelength and the linear sensitivities $\partial c_n/\partial\lambda$ (see equation (2)).

Figure 12B:
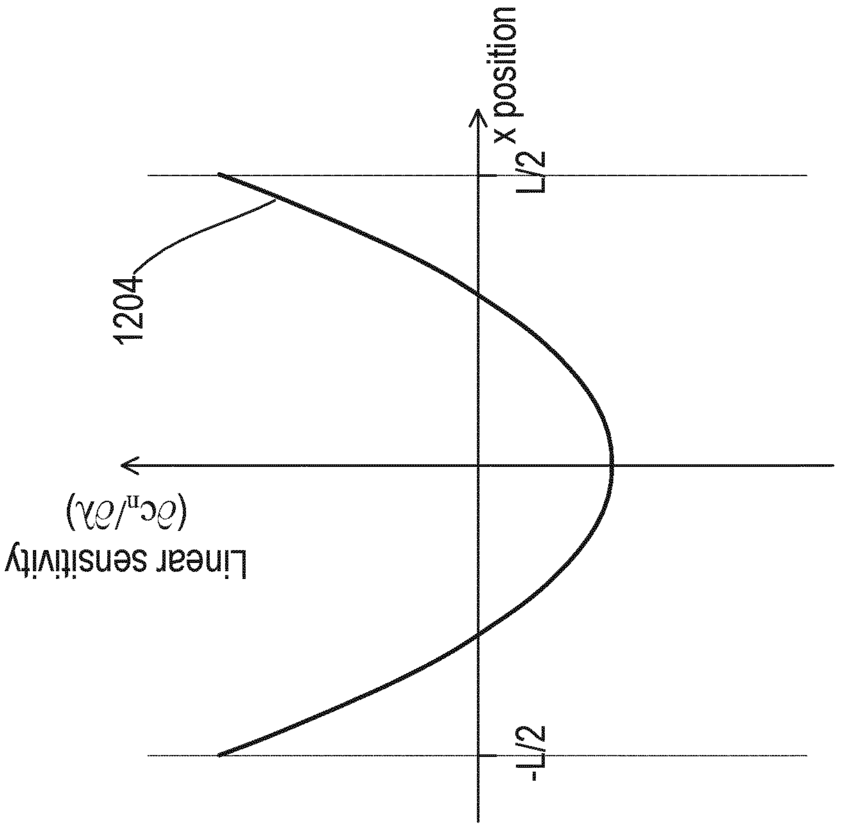
FIGS. 12A and 12B depict sensitivity of Zernike coefficients to a wavelength shift as a function of a slit coordinate (x).
Figure 12A:
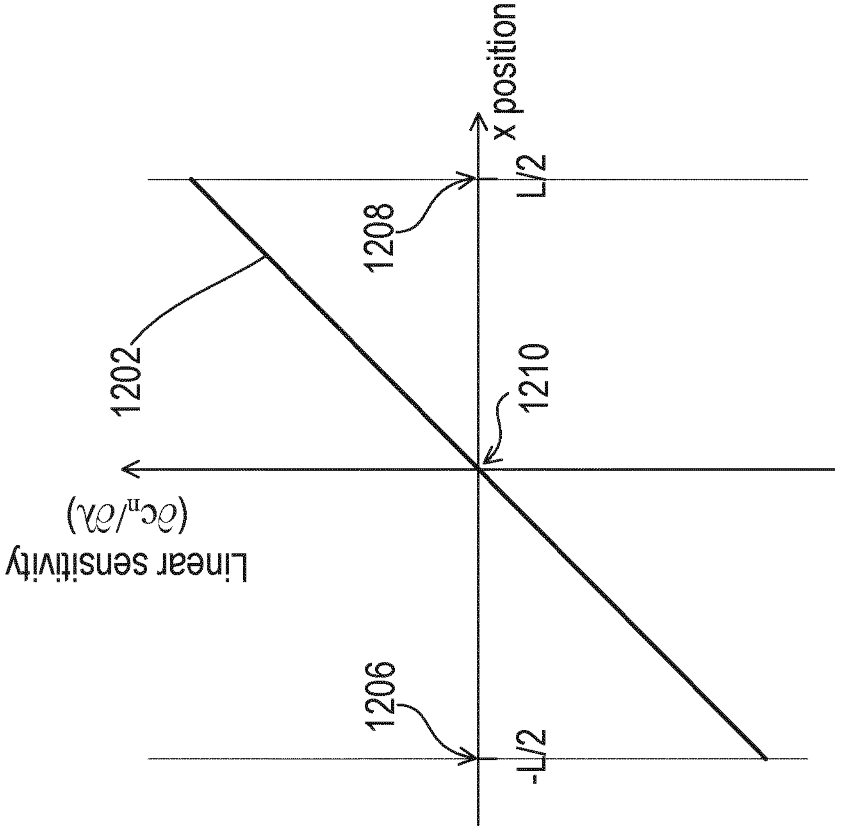

In general, the linear sensitivities $\partial c_n/\partial\lambda$ of the Zernike coefficients are dependent on a position within the slit, in particular, a position within the slit in the non-scanning direction. In the following, the scanning direction will be referred to as the y-direction and the non-scanning direction will be referred to as the x-direction. As will be discussed further below, typically, the linear sensitivities $\partial c_n/\partial\lambda$ of the Zernike coefficients that contribute to a position of an aerial image in a plane of the substrate are either symmetric or anti-symmetric about the centre of the slit. For example, if an origin of the x-axis is chosen to coincide with the centre of the slit then the linear sensitivities $\partial c_n/\partial\lambda$ of the Zernike coefficients that contribute to a position of an aerial image in a plane of the substrate are typically either an even (symmetric) or odd (anti-symmetric) function of x. A schematic example of a linear sensitivity $\partial c_n/\partial\lambda$ 1202 of a Zernike coefficient that is an odd (anti-symmetric) function of x is shown in FIG. 12A and a schematic example of a linear sensitivity $\partial c_n/\partial\lambda$ 1204 of a Zernike coefficient that is an even (symmetric) function of x is shown in FIG. 12B. FIGS. 12A and 12B represent arrangements wherein the origin of the x-axis coincides with the centre of the slit and the slit has a length (an extent in the non-scanning x-direction) of L.

Control over overlay in the non-scanning direction (the x-direction) is now discussed with reference to FIGS. 12A and 13A to 14B. As explained above, the second Zernike coefficient $c_2$ relates to the tilt of a measured wavefront in the x-direction and such a tilt of a wavefront in the x-direction is equivalent to a (first-order) placement in the x-direction. In particular, a non-zero value of the second Zernike coefficient $c_2$ results in a shift $\Delta x$ of the aerial image in the x direction given by:

$$\Delta x = -\frac{c_2}{NA} \qquad (3)$$

where NA is the numerical aperture of the projection system PS. Furthermore, by considering equation (2), for a general wavelength $\lambda$ that differs from a nominal or setpoint wavelength $\lambda_0$ by a wavelength shift $\Delta\lambda=\lambda-\lambda_0$, the shift $\Delta x_\lambda$ of the aerial image in the x direction that results from the deviation $\Delta\lambda$ from the nominal or setpoint wavelength is given by:

$$\Delta x_\lambda = -\frac{\partial c_2/\partial\lambda}{NA}\cdot\Delta\lambda. \qquad (4)$$

It will be appreciated (also from equations (2) and (3)) that, in general, there will also be a contribution $\Delta x_0$ to a shift $\Delta x$ of the aerial image in the x direction from the coefficient of the second Zernike polynomial at the nominal or setpoint wavelength $c_{\lambda_0,2}$ given by:

$$\Delta x_0 = -\frac{c_{\lambda_0,2}}{NA}. \qquad (5)$$

In one example embodiment, the linear sensitivity $\partial c_2/\partial\lambda$ of the second Zernike coefficient is an odd (anti-symmetric) function of x, for example generally of the form of the linear sensitivity $\partial c_n/\partial\lambda$ 1202 shown in FIG. 12A. As can be seen from FIG. 12A, at one end of the slit 1206 the linear sensitivity $\partial c_n/\partial\lambda$ has one sign; at the other end of the slit 1208 the linear sensitivity $\partial c_n/\partial\lambda$ has an opposite sign; and in the middle of the slit 1210 the linear sensitivity is zero.

Figure 13C:
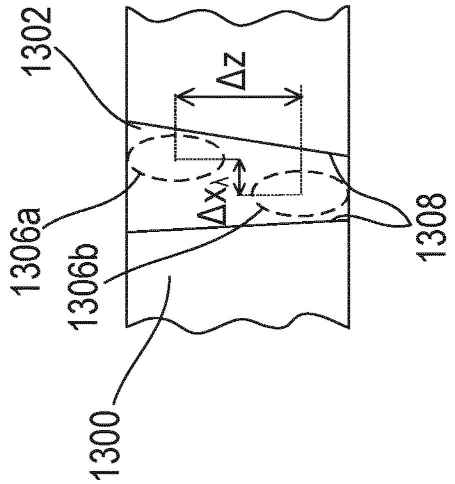
FIG. 13A-C depicts control of an aerial image position in a resist layer.
Figure 13B:
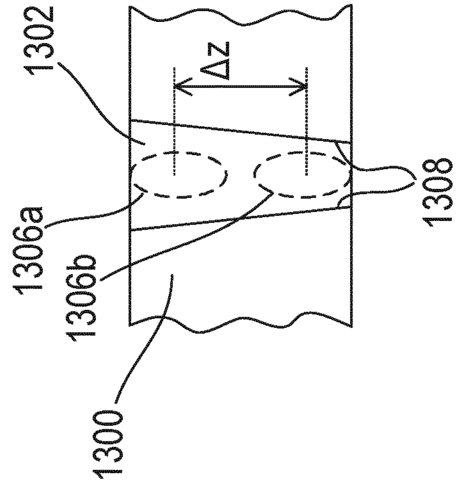
Figure 13A:
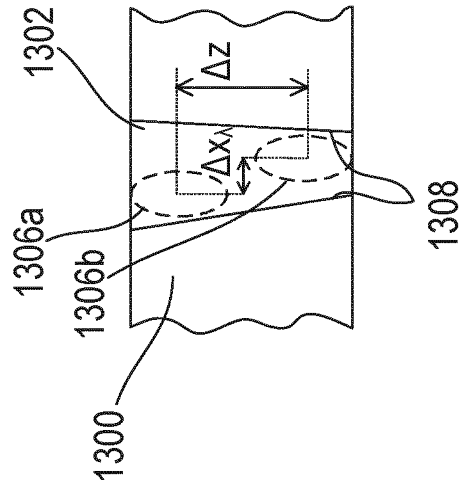

FIGS. 13A, 13B and 13C all show a schematic representation of a part of a layer of resist 1300 (which may, for example, correspond to the first layer of material 502 provided on the surface of the substrate 500 shown in FIG. 5B). Also shown is a feature 1302 that is being formed in the layer of resist 1300 by exposing that feature to a dose of radiation. The feature 1302 is formed by a multi focal imaging (MFI) process wherein a dose of radiation is delivered to the feature 1302 using two discrete wavelength components. Also shown is a schematic representation of the two doses of radiation 1306*a*, 1306*b* delivered to the resist 1300 by the two different wavelength components. The two doses of radiation 1306*a*, 1306*b* delivered to the resist 1300 by the two different wavelength components are substantially equal (each delivering half the total dose). Since the aberrations of the projection system PS are, in general, wavelength dependent (known as chromatic aberrations) the two doses 1306*a*, 1306*b* of radiation are delivered to different regions of the resist 1300, the regions separated by an offset $\Delta z$ (which is dependent on a wavelength difference $\Delta\lambda$ between the two wavelength components).

FIG. 13A represents one end of the slit 1206; FIG. 13B represents the middle of the slit 1210; and FIG. 13C represents the other end of the slit 1208. In each of FIGS. 13A, 13B and 13C, the coefficient of the second Zernike polynomial at the nominal or setpoint wavelength $c_{\lambda_0, 2}$ is assumed to be zero. Therefore, the contribution $\Delta x_0$ to a shift $\Delta x$ of the aerial image in the x direction from the coefficient of the second Zernike polynomial at the nominal or setpoint wavelength $c_{\lambda_0, 2}$ is also 0.

As can be seen from FIG. 13B, because the linear sensitivity is zero in the middle of the slit 1210 (see FIG. 12A), the shift $\Delta x_\lambda$ of the aerial image in the x direction that results from the deviation $\Delta\lambda$ from the nominal or setpoint wavelength are also zero and therefore, the aerial images of the two doses 1306*a*, 1306*b* of radiation are both centred on the same x-position. However, as can be seen from FIG. 13A, at each one end of the slit 1206, the linear sensitivity $\partial c_n/\partial\lambda$ has one sign which results in the aerial images of the two doses 1306*a*, 1306*b* of radiation both being shifted in the x-direction (in opposite directions) relative to a nominal x-position. As a result, the centers mass of the aerial images of the two doses 1306*a*, 1306*b* of radiation are each shifted in opposite directions relative to the nominal x-position and, therefore, the centers mass of the aerial images of the two doses 1306*a*, 1306*b* of radiation are separated by a shift $\Delta x_A$ of the aerial image in the x direction that results from the wavelength difference $\Delta\lambda$ between the two wavelength components. Similarly, as can be seen from FIG. 13C, at the other end of the slit 1208, the linear sensitivity $\partial c_n/\partial\lambda$ has an opposite sign which also results in the aerial images of the two doses 1306*a*, 1306*b* of radiation both being shifted in the x-direction relative to a nominal x-position (but with each of the doses now being shifted in an opposite direction relative to said nominal x-position). As a result, the centers mass of the aerial images of the two doses 1306*a*, 1306*b* of radiation are each shifted in opposite directions relative to the nominal x-position and, therefore, the centers mass of the aerial images of the two doses 1306*a*, 1306*b* of radiation are separated by a shift $\Delta x_A$ of the aerial image in the x direction that results from the wavelength difference $\Delta\lambda$ between the two wavelength components.

It can be seen from FIGS. 13A to 13C that this slit dependence of the linear sensitivity $\partial c_n/\partial\lambda$ results in a variation in the angles of the sidewalls 1308 of the feature 1302 across the slit.

As discussed above, the second Zernike coefficient $c_2$ (which relates to the tilt of a wavefront in the x-direction) provides a first order contribution to a placement of an aerial image in the x-direction. However, it will be appreciated that other Zernike coefficients in a wavefront expansion (of the form of equation (1)) will provide higher order corrections to the placement of the aerial image in the x-direction. For example, in general, Zernike polynomials $Z_n$ (x, y) which are where odd functions of x may contribute to the placement of the aerial image in the x-direction. An odd function of x satisfies $f(-x)=-f(x)$. Such Zernike polynomials $Z_n$ (x, y) which are where odd functions of x include, for example, $Z_7$, $Z_{10}$, $Z_{14}$, $Z_{19}$, $Z_{23}$, $Z_{30}$, and $Z_{34}$. Typically, the linear sensitivities $\partial c_n/\partial\lambda$ of the Zernike coefficients of such Zernike polynomials $Z_n$ (x, y) are also odd (anti-symmetric) functions of x across the slit. In general, a shift $\Delta x$ of the aerial image in the x direction resulting from wavefront aberrations may be given by a modification of equation (3) wherein the second Zernike coefficient $c_2$ is replaced by a weighted sum of all Zernike coefficients $c_n$ that contribute to the placement of the aerial image in the x-direction, where the weights represent sensitivities of the placement of the aerial image in the x-direction to each contributing Zernike polynomial $Z_n$ (x, y). It will be appreciated that these sensitivities may be dependent on an illumination setting of the lithographic apparatus LA (which may characterize an angular distribution of the radiation in a plane of the patterning device MA or, equivalently, an intensity of the radiation beam B in a pupil plane of the illuminator IL).

Similarly, in general, the shift $\Delta x_A$ of an aerial image in the x direction that results from a deviation $\Delta\lambda$ of the wavelength from a nominal or setpoint wavelength is given by a modification of equation (4). In particular, in general, the linear sensitivity $\partial c_2/\partial\lambda$ of the second Zernike coefficient in equation (4) is replaced by a weighted sum of the linear sensitivities $\partial c_n/\partial\lambda$ of the Zernike coefficients $c_n$ that contribute to the placement of the aerial image in the x-direction (where, again, the weights represent sensitivities of the placement of the aerial image in the x-direction to each contributing Zernike polynomial $Z_n$ (x, y)).

Similarly, a contribution $\Delta x_0$ to a shift $\Delta x$ of the aerial image in the x direction from the wavefront aberrations at the nominal or setpoint wavelength is given by a modification of equation (5). In particular, in general, the coefficient of the second Zernike polynomial at the nominal or setpoint wavelength $c_{\lambda_0, 2}$ in equation (5) should be replaced by a weighted sum of the Zernike coefficients at the nominal or setpoint wavelength $c_{\lambda_0,n}$ for the Zernike polynomials that contribute to the placement of the aerial image in the x-direction, where the weights represent sensitivities of the placement of the aerial image in the x-direction to each contributing Zernike polynomial $Z_n$ (x, y).

In some embodiments of the method 400 shown in FIG. 4, a multi focal imaging (MFI) process is used wherein the wavelengths of the plurality of wavelength components of the radiation beam are controlled to provide control over placement of pattern features on the substrate. In particular, the control of the wavelengths of the plurality of wavelength components of the radiation beam, in combination with the adjusting means PA, are used to correct for stress-driven intra-field placement errors in the x-direction. In order to achieve this, during the scanning exposure process, the wavelengths of one or more of the plurality of wavelength components of the radiation beam are controlled, which in turn provides control over the deviation $\Delta\lambda$ of each such wavelength component from the nominal or setpoint wavelength. In turn, as can be seen from equation (3), this provides control over a shift $\Delta x_A$ of the aerial image for that wavelength component in the x direction that results from the deviation $\Delta\lambda$ of each that wavelength component from the nominal or setpoint wavelength. As explained above, the wavelengths of the plurality of wavelength components of the radiation beam can be controlled on a time scale that is significantly less than an exposure time of the substrate (and typical timescales over which changes can be applied to the projection system PS via the adjusting means PA). For example, the radiation beam may be a pulsed radiation beam and the spectrum of the radiation beam may be controlled pulse to pulse (and the exposure may last for tens or hundreds of pulses). As a result, by controlling the wavelengths of one or more of the plurality of wavelength components of the radiation beam during the scanning exposure process, different shifts $\Delta x_A$ of the aerial images for the wavelength components in the x direction can be applied at different positions within the exposure field (i.e. the target region C, see FIG. 1). In this way stress-driven intra-field placement errors in the x-direction can be corrected for.

In addition to control over the shift $\Delta x_\lambda$ of an aerial image for each wavelength component in the x direction that results from the deviation $\Delta\lambda$ of each such wavelength component from the nominal or setpoint wavelength, the adjusting means PA can be used to achieve a set point contribution $\Delta x_0$ to a shift/x of the aerial image in the x direction from wavefront aberrations at the nominal or setpoint wavelength. In general, it may not be possible to use the adjusting means PA to change such aberrations within a field and, therefore, a constant aberration set-point may be chosen for the entire field, i.e. target region C, (or even for the entire substrate W). In general, the set-point level of aberrations (which may be non-zero) are co-optimized with the intra-field corrections applied by varying the wavelengths of the plurality of wavelength components of the radiation beam during the exposure. This is now briefly explained with reference to FIGS. 14A and 14B.

Figure 14A:
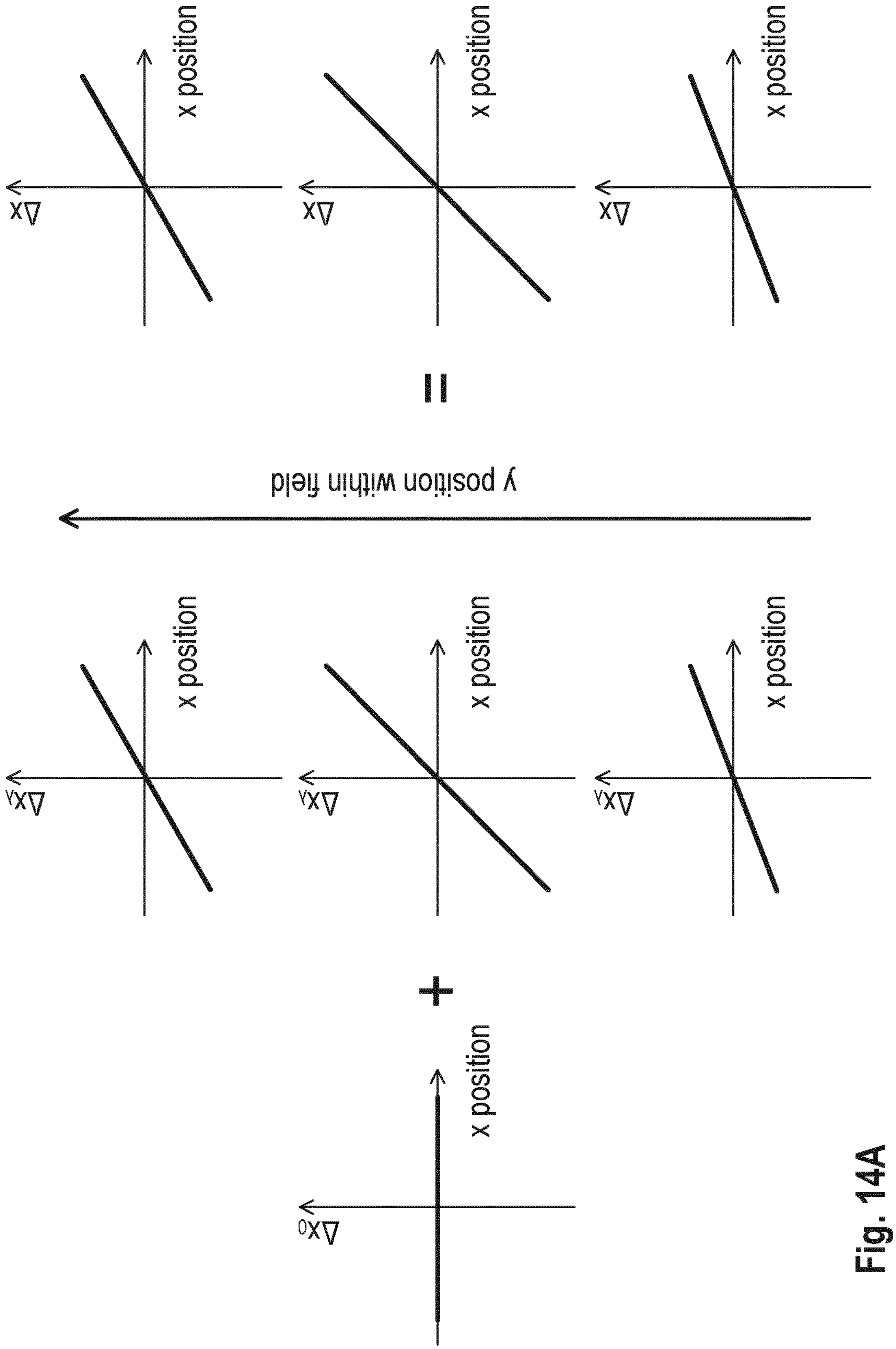
FIGS. 14A and 14B show position shifts in X across the slit direction.
Figure 14B:
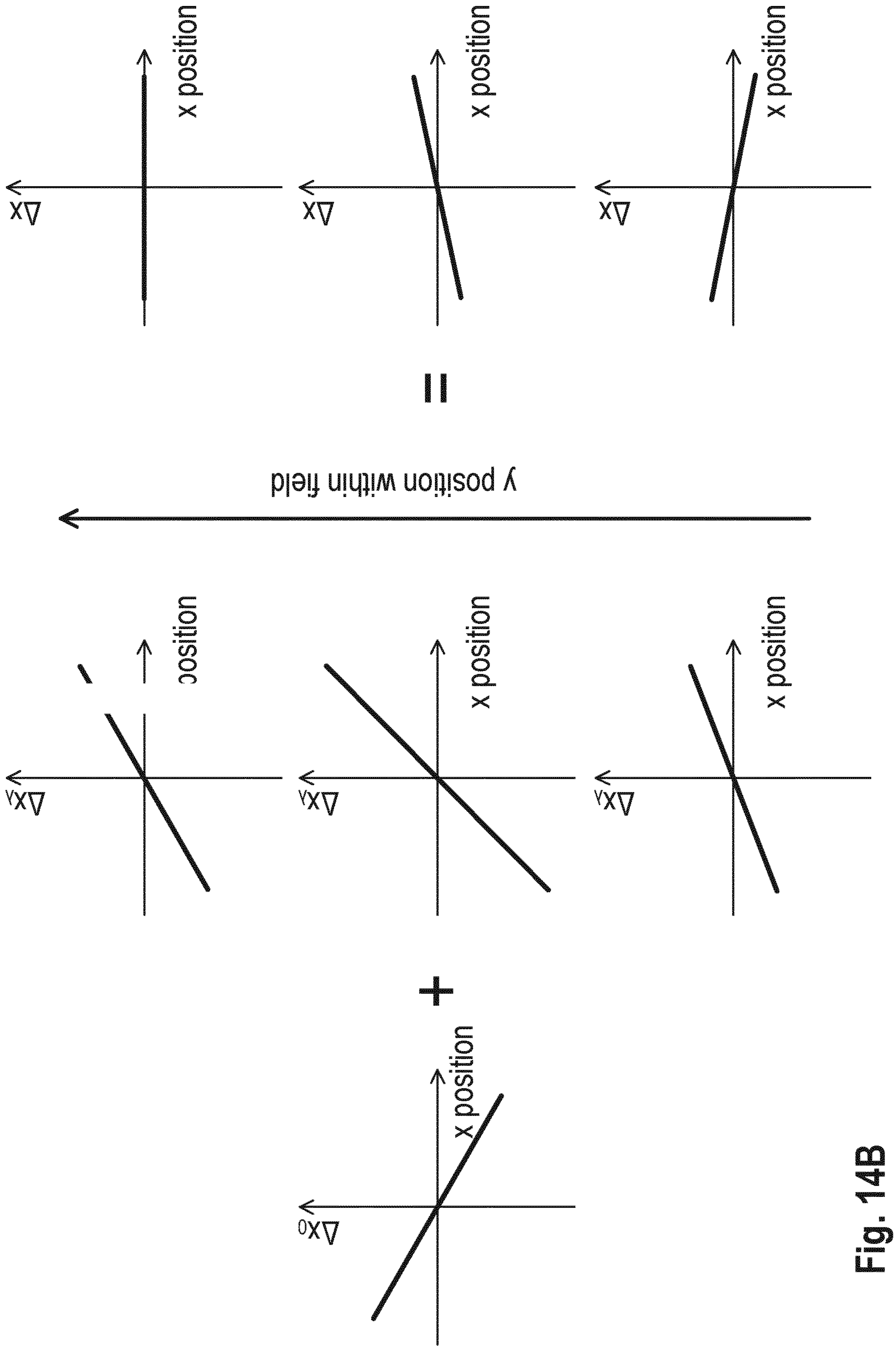

FIGS. 14A and 14B both shows, schematically, how field-dependent shifts $\Delta x$ of an aerial image in the x direction can be applied by applying a constant aberration set-point shift $\Delta x_0$ for the entire field and field-dependent shifts $\Delta x_A$ of the aerial image that result from the deviation $\Delta\lambda$ of each wavelength component from a nominal or setpoint wavelength. By varying the wavelengths of the wavelength components during the scan, the field-dependent shifts $\Delta x_A$ of the aerial image that result from the deviation $\Delta\lambda$ of each wavelength component from a nominal or setpoint wavelength are different at different positions in the scanning direction (schematically represented by three distinct positions in the scanning direction).

In the example shown in FIG. 14A, the set point constant aberration set-point shift $\Delta x_0$ for the entire field is flat across the length of the slit. In the example shown in FIG. 14B, the set point constant aberration set-point shift $\Delta x_0$ for the entire field varies across the length of the slit. It will be appreciated that using the adjusting means PA of the projection system PS, the various different set-point slit dependent shifts $\Delta x_0$ can be achieved for the entire field.

It will also be appreciated that although all of the field-dependent shifts $\Delta x_A$ of the aerial image that result from the deviation $\Delta\lambda$ of each wavelength component from a nominal or setpoint wavelength shown in FIGS. 14A and 14B are shown as linear functions of the x position, in general, other functional forms may be achieved. In general, this will depend on the linear sensitivities $\partial c_n/\partial\lambda$ of the Zernike coefficients $c_n$ that contribute to the placement of the aerial image in the x-direction, the sensitivities of the placement of the aerial image in the x-direction to each contributing Zernike polynomial $Z_n(x, y)$ and the deviation $\Delta\lambda$ of each wavelength component from a nominal or setpoint wavelength.

In general, the linear sensitivities $\partial c_n/\partial\lambda$ of the Zernike coefficients $c_n$ are system dependent and will, for example, generally vary for KrF lithography systems and ArF lithography systems. In addition, generally different peak separations $\Delta\Delta$ are attainable or desired in KrF lithography systems and ArF lithography systems. For example, generally larger peak separations $\Delta\lambda$ are desired in KrF MFI imaging due to thicker resists. Peak separations $\Delta\lambda$ of up to 15 pm may be possible in KrF MFI imaging. It is estimated that this can give rise to shifts $\Delta x_\lambda$ of the aerial image that result from the deviation $\Delta\lambda$ of each wavelength component from a nominal or setpoint wavelength of the order of 100 nm, for example where the linear sensitivities $\partial c_n/\partial\lambda$ are maximal (for example at each end of the slit). In an ArF MFI system peak separations $\Delta\lambda$ of the order of 0.25 pm may be possible. It is estimated that this can give rise to shifts $\Delta x_\lambda$ of the aerial image that result from the deviation $\Delta\lambda$ of each wavelength component from a nominal or setpoint wavelength of the order of 1 nm.

In some embodiments, intra-field overlay or image placement can be controlled in the scanning direction (i.e. the y-direction), as now discussed with reference to FIGS. 12B, 15A and 15B.

As explained above, the third Zernike coefficient $c_3$ relates to the tilt of a measured wavefront in the y-direction and such a tilt of a wavefront in the y-direction is equivalent to a (first-order) placement in the y-direction. In particular, a non-zero value of the third Zernike coefficient $c_3$ results in a shift $\Delta y$ of the aerial image in the y direction given by:

$$\Delta y = -\frac{c_3}{NA} \tag{6}$$

where NA is the numerical aperture of the projection system PS. Again by considering equation (2), for a general wavelength $\lambda$ that differs from a nominal or setpoint wavelength $\lambda_0$ by a wavelength shift $\Delta\lambda=\lambda-\lambda_0$, the shift $\Delta y_\lambda$ of the aerial image in the y direction that results from the deviation $\Delta\lambda$ from the nominal or setpoint wavelength is given by:

$$\Delta y_\lambda = -\frac{\partial c_3/\partial\lambda}{NA}\cdot\Delta\lambda. \tag{7}$$

It will be appreciated (also from equations (2) and (6)) that, in general, there will also be a contribution $\Delta y_0$ to a shift $\Delta y$ of the aerial image in the y direction from the coefficient of the third Zernike polynomial at the nominal or setpoint wavelength $c_{\lambda_0, 3}$ given by:

$$\Delta y_0 = -\frac{c_{\lambda_0,3}}{NA}. \tag{8}$$

In one example embodiment, the linear sensitivity $\partial c_3/\partial\lambda$ of the third Zernike coefficient is an even (symmetric) function of x, for example generally of the form of the linear sensitivity $\partial c_n/\partial\lambda$ 1204 shown in FIG. 12B.

The third Zernike coefficient $c_3$ (which relates to the tilt of a wavefront in the y-direction) provides a first order contribution to a placement of an aerial image in the y-direction. However, it will be appreciated that other Zernike coefficients in a wavefront expansion (of the form of equation (1)) will provide higher order corrections to the placement of the aerial image in the y-direction. For example, in general, Zernike polynomials $Z_n(x, y)$ which are where odd functions of y may contribute to the placement of the aerial image in the y-direction. An odd function of y satisfies $f(-y)=-f(y)$. Such Zernike polynomials $Z_n(x, y)$ which are where odd functions of y include, for example, $Z_8$, $Z_{11}$, $Z_{15}$, $Z_{20}$, $Z_{24}$, $Z_{31}$, and $Z_{35}$. Typically, the linear sensitivities $\partial c_n/\partial\lambda$ of the Zernike coefficients of such Zernike polynomials $Z_n$ (x, y) are also even (symmetric) functions of x across the slit. In general, a shift $\Delta y$ of the aerial image in the y direction resulting from wavefront aberrations may be given by a modification of equation (6) wherein the third Zernike coefficient $c_3$ is replaced by a weighted sum of all Zernike coefficients $c_n$ that contribute to the placement of the aerial image in the y-direction, where the weights represent sensitivities of the placement of the aerial image in the y-direction to each contributing Zernike polynomial $Z_n$ (x, y). It will be appreciated that these sensitivities may be dependent on an illumination setting of the lithographic apparatus LA (which may characterize an angular distribution of the radiation in a plane of the patterning device MA or, equivalently, an intensity of the radiation beam B in a pupil plane of the illuminator IL).

Similarly, in general, the shift $\Delta y_\lambda$ of an aerial image in the y direction that results from a deviation $\Delta\lambda$ of the wavelength from a nominal or setpoint wavelength is given by a modification of equation (7). In particular, in general, the linear sensitivity $\partial c_3/\partial\lambda$ of the third Zernike coefficient in equation (7) is replaced by a weighted sum of the linear sensitivities $\partial c_n/\partial\lambda$ of the Zernike coefficients $c_n$ that contribute to the placement of the aerial image in the y-direction (where, again, the weights represent sensitivities of the placement of the aerial image in the y-direction to each contributing Zernike polynomial $Z_n$ (x, y)).

Similarly, a contribution $\Delta y_0$ to a shift $\Delta y$ of the aerial image in the y direction from the wavefront aberrations at the nominal or setpoint wavelength is given by a modification of equation (8). In particular, in general, the coefficient of the third Zernike polynomial at the nominal or setpoint wavelength $c_{\lambda_0, 3}$ in equation (5) should be replaced by a weighted sum of the Zernike coefficients at the nominal or setpoint wavelength $c_{\lambda_0,n}$ for the Zernike polynomials that contribute to the placement of the aerial image in the y-direction, where the weights represent sensitivities of the placement of the aerial image in the y-direction to each contributing Zernike polynomial $Z_n$ (x, y).

In some embodiments of the method 400 shown in FIG. 4, a multi focal imaging (MFI) process is used wherein the wavelengths of the plurality of wavelength components of the radiation beam are controlled to provide control over placement of pattern features on the substrate. In particular, the control of the wavelengths of the plurality of wavelength components of the radiation beam, in combination with the adjusting means PA, are used to correct for stress-driven intra-field placement errors in the y-direction. In order to achieve this, during the scanning exposure process, the wavelengths of one or more of the plurality of wavelength components of the radiation beam are controlled, which in turn provides control over the deviation $\Delta\lambda$ of each such wavelength component from the nominal or setpoint wavelength. In turn, as can be seen from equation (7), this provides control over a shift $\Delta y_\lambda$ of the aerial image for that wavelength component in the y direction that results from the deviation $\Delta\lambda$ of each wavelength component from the nominal or setpoint wavelength. As explained above, the wavelengths of the plurality of wavelength components of the radiation beam can be controlled on a time scale that is significantly less than an exposure time of the substrate (and typical timescales over which changes can be applied to the projection system PS via the adjusting means PA). For example, the radiation beam may be a pulsed radiation beam and the spectrum of the radiation beam may be controlled pulse to pulse (and the exposure may last for tens or hundreds of pulses). As a result, by controlling the wavelengths of one or more of the plurality of wavelength components of the radiation beam during the scanning exposure process, different shifts $\Delta y_\lambda$ of the aerial images for the wavelength components in the y direction can be applied at different positions within the exposure field (i.e. the target region C, see FIG. 1). In this way stress-driven intra-field placement errors in the x-direction can be corrected for.

In addition to control over the shift $\Delta yx_\lambda$ of an aerial image for each wavelength component in the x direction that results from the deviation $\Delta\lambda$ of each such wavelength component from the nominal or setpoint wavelength, the adjusting means PA can be used to achieve a set point contribution $\Delta y_0$ to a shift $\Delta y$ of the aerial image in the y direction from wavefront aberrations at the nominal or setpoint wavelength. In general, it may not be possible to use the adjusting means PA to change such aberrations within a field and, therefore, a constant aberration set-point may be chosen for the entire field, i.e. target region C, (or even for the entire substrate W). In general, the set-point level of aberrations (which may be non-zero) are co-optimized with the intra-field corrections applied by varying the wavelengths of the plurality of wavelength components of the radiation beam during the exposure. This is now briefly explained with reference to FIGS. 15A and 15B.

Figure 15A:
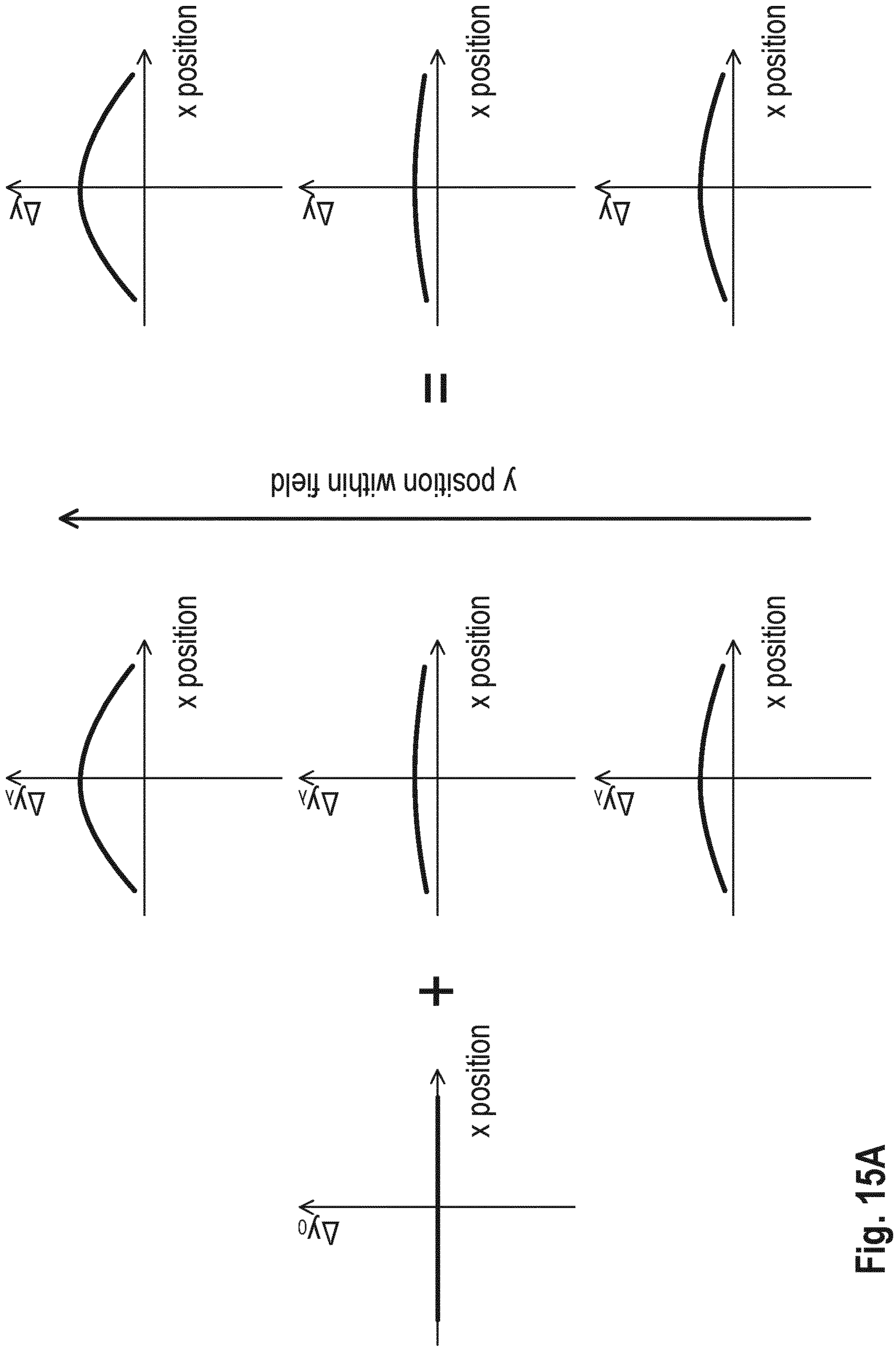
FIGS. 15A and 15B show position shifts in Y across the slit direction.
Figure 15B:
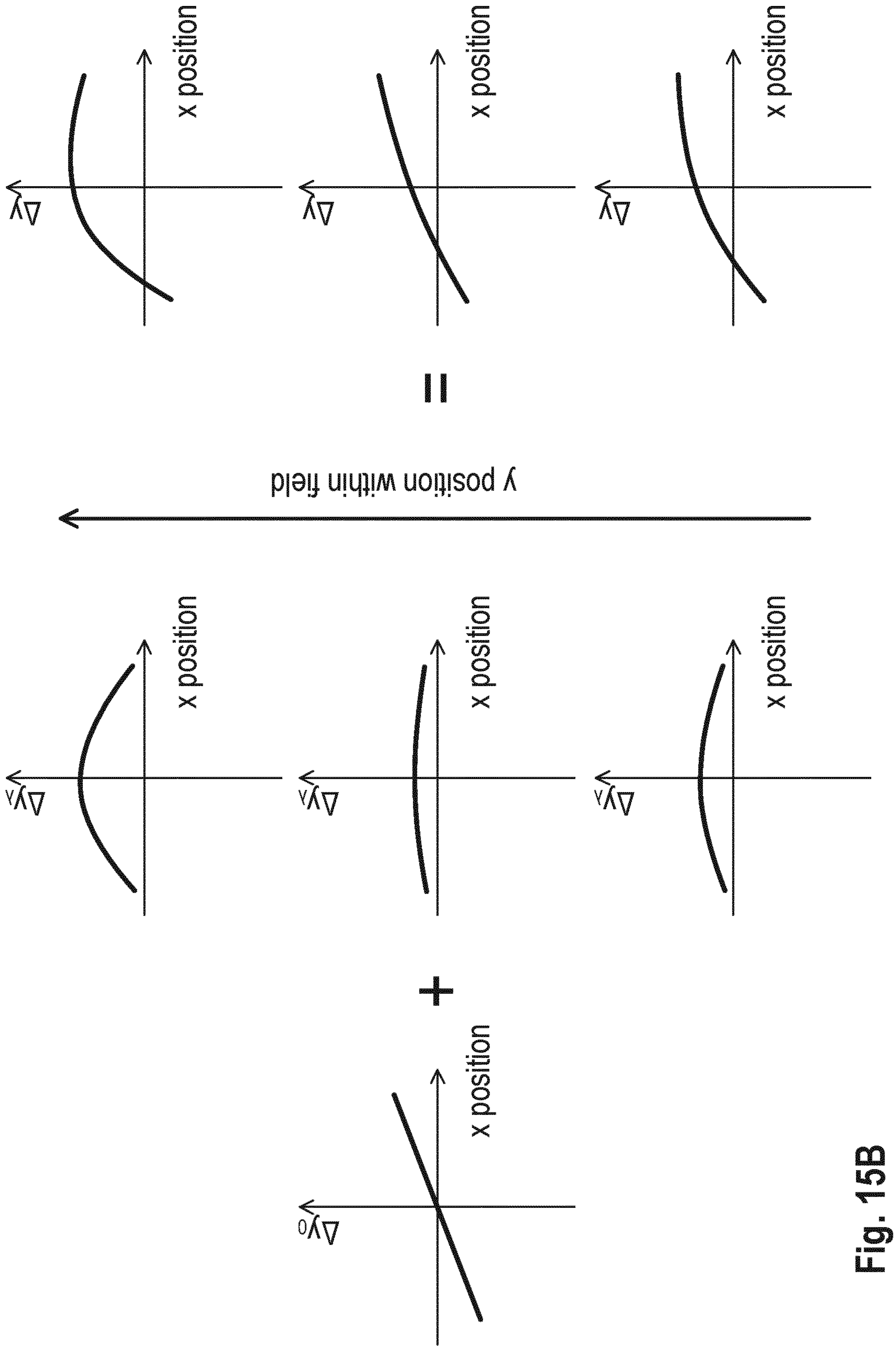

FIGS. 15A and 15B both show, schematically, how field-dependent shifts $\Delta y$ of an aerial image in the y direction can be applied by applying a constant aberration set-point shift $\Delta y_0$ for the entire field and field-dependent shifts $\Delta y_\lambda$ of the aerial image that result from the deviation $\Delta\lambda$ of each wavelength component from a nominal or setpoint wavelength. By varying the wavelengths of the wavelength components during the scan, the field-dependent shifts $\Delta y_\lambda$ of the aerial image that result from the deviation $\Delta\lambda$ of each wavelength component from a nominal or setpoint wavelength are different at different positions in the scanning direction (schematically represented by three distinct positions in the scanning direction).

In the example shown in FIG. 15A, the set point constant aberration set-point shift $\Delta y_0$ for the entire field is flat across the length of the slit. In the example shown in FIG. 15B, the set point constant aberration set-point shift $\Delta y_0$ for the entire field varies across the length of the slit. It will be appreciated that using the adjusting means PA of the projection system PS, the various different set-point slit dependent shifts $\Delta y_0$ can be achieved for the entire field.

It will also be appreciated that although all of the field-dependent shifts $\Delta y_\lambda$ of the aerial image that result from the deviation $\Delta\lambda$ of each wavelength component from a nominal or setpoint wavelength shown in FIGS. 15A and 15B are shown as a single symmetric (generally parabolic) function of the x position that is scaled differently at different positions within the scan, in general, other functional forms may be achieved. In general, this will depend on the linear sensitivities $\partial c_n/\partial\lambda$ of the Zernike coefficients $c_n$ that contribute to the placement of the aerial image in the y-direction, the sensitivities of the placement of the aerial image in the y-direction to each contributing Zernike polynomial $Z_n(x, y)$ and the deviation $\Delta\lambda$ of each wavelength component from a nominal or setpoint wavelength.

In general, the linear sensitivities $\partial c_n/\partial\lambda$ of the Zernike coefficients $c_n$ are system dependent and will, for example, generally vary for KrF lithography systems and ArF lithography systems. In addition, generally different peak separations $\Delta\lambda$ are attainable or desired in KrF lithography systems and ArF lithography systems. For example, generally larger peak separations $\Delta\lambda$ are desired in KrF MFI imaging due to thicker resists. Peak separations $\Delta\lambda$ of up to 15 pm may be possible in KrF MFI imaging. It is estimated that this can give rise to shifts $\Delta x_\lambda$ of the aerial image that result from the deviation $\Delta\lambda$ of each wavelength component from a nominal or setpoint wavelength of the order of 100 nm, for example where the linear sensitivities $\partial c_n/\partial\lambda$ are maximal (for example at each end of the slit). In an ArF MFI system peak separations $\Delta\lambda$ of the order of 0.25 pm may be possible. It is estimated that this can give rise to shifts $\Delta x_\lambda$ of the aerial image that result from the deviation $\Delta\lambda$ of each wavelength component from a nominal or setpoint wavelength of the order of 1 nm.

In some embodiments, the set point shifts $\Delta x_0$ and $\Delta y_0$ may be chosen to generally cancel the shifts $\Delta x_\lambda$ and $\Delta y_\lambda$ of the aerial image that result from the deviation $\Delta\lambda$ of each wavelength component from a nominal or setpoint wavelength. This may allow for a more constant or flat aberration profile across the shy (also known as the slit fingerprint).

In these embodiments as discussed with reference to FIGS. 12A to 15B, a design layout relative to a scanning direction may be optimised to allow for maximum overlay correction capability.

As discussed above, using MFI does not significantly reduce image contrast for KrF imaging. In case of ArF imaging contrast loss is expected although this may be mitigated using source-mask optimization. Furthermore, it will be appreciated that varying set-point aberrations of the projection system (which result in the set point shifts $\Delta x_0$ and $\Delta y_0$) may also change image contrast. Again, this may be mitigated using source-mask optimization.

It will be appreciated that in some embodiments, the method 400 may comprise forming a plurality of intermediate pattern features and a plurality of pattern features therefrom.

It will be appreciated from the discussion accompanying FIGS. 8C to 8F that controlling of the spectrum of the radiation beam may comprise changing the spectrum of the radiation beam relative to a nominal or default spectrum. In some embodiments, this change of the spectrum of the radiation beam relative to a nominal or default spectrum may only be performed for a subset of intermediate pattern features on a substrate. For example, the control provided by spectral control of the radiation beam may only be undertaken if the intermediate pattern feature is of a specific type (for example a critical feature). Less critical features (for example high contrast features) may be formed using the nominal or default spectrum, which may provide adequate positioning and sizing of such less critical features.

It will be appreciated that in some embodiments, the substrate may comprises a plurality of target portions. For example, as shown in FIG. 1, the substrate W may comprise a plurality of target portion C (e.g., comprising one or more dies). For such embodiments, the step 420 of forming the image of the patterning device on the substrate with the radiation beam using a projection system to form the intermediate pattern feature may comprise forming said image on each of the plurality of target portions C to form the intermediate pattern feature on each of the plurality of target portions C. In practice a plurality of intermediate pattern features may be formed on each of the plurality of target portions C. For such embodiments, the control of the spectrum of the radiation beam (step 430) may be dependent on the target portion C upon which the image of the patterning device is being formed. For example, the spectrum of the radiation beam may be controlled differently for central target portions C of the substrate and for edge target portions C of the substrate. That is, the spectral control applied by method 400 may be field dependent. For example, the spectrum of the radiation beam may be at, or closer to, a nominal or default spectrum for central target portions C of the substrate whereas a greater deviation from said nominal or default spectrum may be used for edge target portions of the substrate (for example to correct for greater errors).

It will be appreciated that for such embodiments wherein the substrate comprises a plurality of target portions, the one or more subsequent processes applied to the substrate to form the pattern feature may comprise subsequent processing of the substrate to form the pattern feature(s) on each of the plurality of target portions.

In some embodiments the control of the spectrum of the radiation beam may comprise varying the spectrum of the radiation beam while forming the image of the patterning device on the substrate. That is, the method may comprise dynamic control of the spectrum of the radiation beam that is applied during exposure of the substrate. It will be appreciated that the exposure may be a scanning exposure and therefore such dynamic control of the spectrum of the radiation beam may allow different corrections to be applied for different parts of the exposed field. Such corrections may be referred to as intra-field corrections. For embodiments wherein the substrate comprises a plurality of target portions C, in general, different intra-field corrections may be applied to each different target portion.

The one or more parameters of the one or more subsequent processes applied to the substrate (upon which the control of the spectrum of the radiation beam may be dependent) may be determined from a measurement of a previously formed pattern feature. For example, measurement of a previously formed pattern feature may be performed by an inspection apparatus that may form part of the lithographic cell LC shown in FIG. 2 or by the metrology tool MT shown in FIG. 3.

That is, a pattern feature on a previously formed substrate may be measured in order to determine dimensions and/or positions of the pattern feature. For example, a metrology tool may be used to determine a pitch or pitch variation (known as pitch walk) of the pattern feature on the previously formed substrate. Additionally or alternatively, a metrology tool may be used to determine an overlay of the pattern feature on the previously formed substrate. As used here (and as known in the art), overlay is intended to mean an error in the relative position of a feature (for example, relative to a previously formed feature on the substrate).

Figure 9:
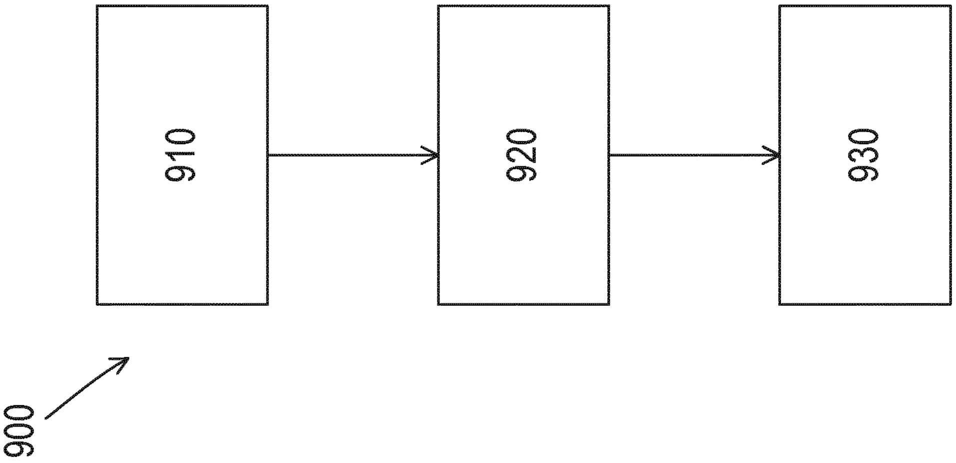
FIG. 9 is a schematic block diagram for a method for determining a spectrum or a spectrum correction for a radiation beam comprising a plurality of wavelength components for use in forming an image of a patterning device on a substrate according to an embodiment of the present invention.

FIG. 9 is a schematic block diagram for a method 900 for determining a spectrum or a spectrum correction for a radiation beam comprising a plurality of wavelength components for use in forming an image of a patterning device on a substrate according to an embodiment of the present invention.

The method 900 comprises a step 910 of measuring the one or more parameters of a previously formed pattern feature. For example, measurement of one or more parameters of a previously formed pattern feature may be performed by an inspection apparatus that may form part of the lithographic cell LC shown in FIG. 2 or by the metrology tool MT shown in FIG. 3.

The method 900 comprises a step 920 of determining a correction based on the one or more measured parameters.

For example, the correction may be a suitable correction to cancel a position or pitch error as determined at step 910.

The method 900 comprises a step 930 of determining the spectrum or spectrum correction for a radiation beam based on the correction.

A spectrum or spectrum correction determined by the method 900 shown in FIG. 9 may be used in the method 400 shown in FIG. 4.

According to the method 900 shown in FIG. 9, a pattern feature on a previously formed substrate may be measured in order to determine dimensions and/or positions of the pattern feature. The pattern feature on the previously formed substrate have been formed by forming an image of a patterning device on the substrate with a radiation beam using a nominal or default spectrum (for example such as is described with reference to FIG. 8B) and subsequently applying one or more subsequent processes to the substrate to form the pattern feature.

The one or more parameters of a previously formed pattern feature may characterize an error in the position and/or dimension of the previously formed pattern feature. For example, a metrology tool may be used to determine pitch variation (known as pitch walk) of the pattern feature on the previously formed substrate. Additionally or alternatively, a metrology tool may be used to determine an overlay of the pattern feature on the previously formed substrate (i.e. an error in the position of the feature).

The spectrum or spectrum correction may comprise a wavelength or wavelength correction of at least one of a plurality of wavelength components of the radiation beam.

The spectrum or spectrum correction may comprise a dose or dose correction of at least one of a plurality of wavelength components.

The spectrum or spectrum correction may be determined for each of a plurality of target portions of a substrate. That is, the spectrum or spectrum correction may be field dependent.

The spectrum or spectrum correction may be determined as a function of position on the substrate. That is, the spectrum or spectrum correction, in general, varies in dependence on position on the substrate (and may comprise intra-field corrections).

According to some embodiments of the present invention there is provided a lithographic system comprising a controller operable to control an adjustment mechanism of a radiation source so as to configure an image of a patterning device based on an expected characteristic of one or more subsequent processes targeted to translate the image to a pattern on a substrate. The lithographic system may comprise any of the features described above with reference to FIGS. 1 to 3. The lithographic system may be operable to implement the method 400 shown in FIG. 4 and described above and/or the method 900 shown in FIG. 9 and described above.

According to some embodiments of the present invention there is provided a computer program comprising program instructions operable to perform the method 400 shown in FIG. 4 and described above when run on a suitable apparatus. According to some embodiments of the present invention there is provided a computer program comprising program instructions operable to perform the method 900 shown in FIG. 9 and described above when run on a suitable apparatus. According to some embodiments of the present invention there is provided a non-transient computer program carrier comprising such a computer program. Such computer programs may be run on any of the above-described computing apparatus such as, for example, the supervisory control system SCS, the track control unit TCU or the lithography control unit LACU shown in FIG. 2 or the computer system CL shown in FIG. 3.

Further embodiments of the invention are disclosed in the list of numbered clauses below:

1. A method of forming a pattern feature on a substrate, the method comprising: providing a radiation beam comprising a plurality of wavelength components; forming an image of a patterning device on the substrate with the radiation beam using a projection system to form an intermediate pattern feature on the substrate, wherein a plane of best focus of the image is dependent on a wavelength of the radiation beam; and controlling a spectrum of the radiation beam in dependence on one or more parameters of one or more subsequent processes applied to the substrate to form the pattern feature so as to control a dimension and/or position of the pattern feature.

2. The method of clause 1 wherein controlling the spectrum of the radiation beam comprises controlling a wavelength of at least one of the plurality of wavelength components.

3. The method of clause 1 or clause 2 wherein controlling the spectrum of the radiation beam comprises controlling a dose of at least one of the plurality of wavelength components.

4. The method of any preceding clause further comprising controlling an overall focus of the radiation beam independently of the spectrum of the radiation beam.

5. The method of any preceding clause further comprising controlling a total dose independently of the spectrum of the radiation beam.

6. The method of any preceding clause wherein before providing the radiation beam and forming the image of the patterning device, the method comprises providing a surface of the substrate with a first layer of material.

7. The method of any preceding clause further comprising applying one or more subsequent processes to the substrate to form the pattern feature on the substrate.

8. The method of any preceding clause wherein the one or more subsequent processes applied to the substrate comprises: developing a layer of material on the substrate to form the intermediate pattern feature;

providing a second layer of material over the intermediate pattern feature, the second layer of material providing a coating on sidewalls of the intermediate pattern feature; removing a portion of the second layer of material, leaving a coating of the second layer of material on sidewalls of the intermediate pattern feature; and removing the intermediate pattern feature formed from the first layer of material, leaving on the substrate at least a part of the second layer of material that formed a coating on sidewalls of that intermediate pattern feature, the part of the second layer of material left on the substrate forming pattern features in locations adjacent to the locations of sidewalls of the removed intermediate pattern feature.

9. The method of clause 8 wherein controlling the spectrum of the radiation beam provides control over a sidewall angle of the sidewalls of the intermediate pattern feature, thereby affecting a dimension of the coating of the second layer of material on the sidewalls of the intermediate pattern feature.

10. The method of any preceding clause wherein the one or more subsequent processes applied to the substrate comprises: developing a layer of material on the substrate to form the pattern feature.

11. The method of any preceding clause wherein the one or more parameters of the one or more subsequent processes applied to the substrate are determined from a measurement of a previously formed pattern feature.

12. The method of any preceding clause wherein controlling the spectrum of the radiation beam comprises changing the spectrum of the radiation beam relative to a nominal or default spectrum for a subset of the intermediate pattern feature.

13. The method of any preceding clause wherein the substrate comprises a plurality of target portions and wherein forming the image of the patterning device on the substrate with the radiation beam using a projection system to form the intermediate pattern feature comprises forming said image on each of the plurality of target portions to form the intermediate pattern feature on each of the plurality of target portions; and wherein the control of the spectrum of the radiation beam is dependent on the target portion upon which the image of the patterning device is being formed.

14. The method of any preceding clause wherein the control of the spectrum of the radiation beam comprises varying the spectrum of the radiation beam while forming the image of the patterning device on the substrate.

15. The method of clause 14 wherein forming the image of the patterning device on the substrate comprises a scanning exposure wherein the patterning device and/or the substrate are moved relative to the radiation beam as the image is being formed.

16. The method of any preceding clause further comprising transferring the pattern feature to the substrate.

17. The method of any preceding clause further comprising controlling one or more parameters of the projection system to maintain a set point aberration independently of the spectrum of the radiation beam.

18. A lithographic system comprising: a radiation source operable to produce a radiation beam comprising a plurality of wavelength components; an adjustment mechanism operable to control a spectrum of the radiation beam; a support structure for supporting a patterning device such that the radiation beam can be incident on said patterning device; a substrate table for supporting a substrate; a projection system operable to project the radiation beam onto a target portion of the substrate so as to form an image of the patterning device on the substrate wherein a plane of best focus of the image is dependent on a wavelength of the radiation beam; and a controller operable to control the adjustment mechanism so as to configure the image based on an expected characteristic of one or more subsequent processes targeted to translate the image to a pattern on the substrate.

19. A method for determining a spectrum or a spectrum correction for a radiation beam comprising a plurality of wavelength components for use in forming an image of a patterning device on a substrate, the method comprising: measuring the one or more parameters of a previously formed pattern feature; determining a correction based on the one or more measured parameters; and determining the spectrum or spectrum correction for a radiation beam based on the correction.

20. The method of clause 19 wherein the spectrum or spectrum correction comprises controlling a wavelength or wavelength correction of at least one of the plurality of wavelength components.

21. The method of clause 19 or clause 20 wherein the spectrum or spectrum correction comprises a dose or dose correction of at least one of the plurality of wavelength components.

22. The method of any one of clauses 19 to 21 wherein the substrate comprises a plurality of target portions and wherein a spectrum or spectrum correction is determined for each of the plurality of target portions.

23. The method of any one of clauses 19 to 22 wherein the spectrum or spectrum correction is determined as a function of position on the substrate.

24. A computer program comprising program instructions operable to perform the method of any one of clauses 1 to 17 when run on a suitable apparatus.

25. The computer program of clause 24 wherein the program instructions comprise a spectrum or spectrum correction determined by the method according to any one of clauses 17 to 21.

26. A non-transient computer program carrier comprising the computer program of clause 24 or clause 25.

27. A method of forming a pattern on a substrate using a lithographic apparatus provided with a patterning device and a projection system having chromatic aberrations, the method comprising: providing a radiation beam comprising a plurality of wavelength components to the patterning device; forming an image of the patterning device on the substrate using the projection system to form said pattern, wherein a position of the pattern is dependent on a wavelength of the radiation beam due to said chromatic aberrations; and controlling a spectrum of the radiation beam to control the position of the pattern.

28. The method of clause 27, wherein the position is controlled to control overlay of the pattern with respect to a previous layer on the substrate.

29. The method of clause 27, wherein the chromatic aberrations comprise at least one or more asymmetric wavefront aberrations which depend on the wavelength of the radiation beam.

30. The method of clause 29, wherein the asymmetric wavefront aberrations are associated with a tilt of the wavefront of the projection lens.

31. The method of clause 30, wherein forming the image of the patterning device on the substrate comprises a scanning operation wherein the patterning device and/or the substrate are moved relative to the radiation beam in a scanning direction as the image is being formed.

32. The method of clause 31, wherein the tilt of the wavefront is associated with a position shift of the pattern along the scanning direction and the spectrum of the radiation beam is controlled to correct for overlay errors along the scanning direction.

33. The method of clause 31, wherein the tilt of the wavefront is associated with a position shift of the pattern along a non-scanning direction being perpendicular to the scanning direction and the spectrum of the radiation beam is controlled to correct for overlay errors along the non-scanning direction.

34. The method of clause 32 or 33, wherein the dependency of the tilt on the wavelength of the radiation beam varies along the non-scanning direction and the spectrum of the radiation beam is controlled to correct for overlay error variation along the non-scanning direction.

35. The method of any of clauses 31 to 34, wherein the control of the spectrum of the radiation beam comprises varying the spectrum of the radiation beam during the scanning operation to correct for overlay error variation along the scanning direction.

36. The method of any of clauses 27 to 35, wherein controlling the spectrum of the radiation beam comprises controlling a wavelength of at least one of the plurality of wavelength components.

37. The method of any of clauses 27 to 36, wherein controlling the spectrum of the radiation beam comprises controlling a dose of at least one of the plurality of wavelength components.

38. The method of any of clauses 27 to 37, wherein the substrate comprises a plurality of target portions and wherein forming the image of the patterning device on the substrate with the radiation beam using the projection system comprises forming said image on each of the plurality of target portions; and wherein the control of the spectrum of the radiation beam is dependent on the target portion upon which the image of the patterning device is being formed.

39. A computer program product comprising machine readable instructions for determining a spectrum of a radiation beam comprising a plurality of wavelength components used in forming an image of a patterning device on a substrate in a lithographic apparatus, wherein the lithographic apparatus comprises a projection system having chromatic aberrations, the instructions configured to: obtain a dependency of a position on the substrate of a pattern associated with the patterning device on a wavelength of the radiation beam due to said chromatic aberrations; and determine the spectrum of the radiation beam based on a desired position of the pattern on the substrate and said dependency.

40. The computer program product of clause 39, wherein the instructions configured to determine the spectrum are based on controlling overlay of the pattern with respect to a previous layer on the substrate.

41. The computer program product of clause 40, wherein the chromatic aberrations are associated with a tilt of the wavefront and the spectrum of the radiation beam is controlled to correct for overlay error variation along a direction of scanning of the lithographic apparatus.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of forming a pattern on a substrate using a lithographic apparatus provided with a patterning device and a projection system having chromatic aberrations, the method comprising:

providing a radiation beam comprising a plurality of wavelength components to the patterning device;

forming an image of the patterning device on the substrate using the projection system to form the pattern, wherein a position of the pattern in a direction that extends within a two-dimensional major surface of the substrate is dependent on a wavelength of the radiation beam due to the chromatic aberrations; and controlling a spectrum of the radiation beam to control the position of the pattern.

2. The method of claim 1, wherein the position is controlled to control overlay of the pattern with respect to a previous layer on the substrate.

3. The method of claim 1, wherein the chromatic aberrations comprise at least one or more asymmetric wavefront aberrations which depend on the wavelength of the radiation beam.

4. The method of claim 3, wherein the one or more asymmetric wavefront aberrations are associated with a tilt of the wavefront of the projection system.

5. The method of claim 4, wherein forming the image of the patterning device on the substrate comprises a scanning operation wherein the patterning device and/or the substrate are moved relative to the radiation beam in a scanning direction as the image is being formed.

6. The method of claim 5, wherein the tilt of the wavefront is associated with a position shift of the pattern along the scanning direction and the spectrum of the radiation beam is controlled to correct for overlay error along the scanning direction.

7. The method of claim 6, wherein the dependency of the tilt on the wavelength of the radiation beam varies along the non-scanning direction and the spectrum of the radiation beam is controlled to correct for overlay error variation along the non-scanning direction.

8. The method of claim 5, wherein the tilt of the wavefront is associated with a position shift of the pattern along a non-scanning direction being perpendicular to the scanning direction and the spectrum of the radiation beam is controlled to correct for overlay error along the non-scanning direction.

9. The method of claim 5, wherein the control of the spectrum of the radiation beam comprises varying the spectrum of the radiation beam during the scanning operation to correct for overlay error variation along the scanning direction.

10. The method of claim 1, wherein controlling the spectrum of the radiation beam comprises controlling a wavelength of at least one of the plurality of wavelength components.

11. The method of claim 1, wherein controlling the spectrum of the radiation beam comprises controlling a dose of at least one of the plurality of wavelength components.

12. The method of claim 1, wherein the substrate comprises a plurality of target portions; and wherein forming the image of the patterning device on the substrate with the radiation beam using the projection system comprises forming the image on each of the plurality of target portions; and wherein the control of the spectrum of the radiation beam is dependent on the target portion upon which the image of the patterning device is being formed.

13. A computer program product comprising a non-transitory computer-readable medium having machine readable instructions therein for determining a spectrum of a radiation beam comprising a plurality of wavelength components used in forming an image of a patterning device on a substrate in a lithographic apparatus, wherein the lithographic apparatus comprises a projection system having chromatic aberrations, the instructions, when executed, configured to cause a computer system to at least:

obtain a dependency of a position in a direction that extends within a two-dimensional major surface of the substrate of a pattern associated with the patterning device on a wavelength of the radiation beam due to the chromatic aberrations; and determine the spectrum of the radiation beam based on a desired position of the pattern on the substrate and the dependency.

14. The computer program product of claim 13, wherein the instructions are further configured to cause the computer system to determine the spectrum to control overlay of the pattern with respect to a previous layer on the substrate.

15. The computer program product of claim 14, wherein the chromatic aberrations are associated with a tilt of the wavefront and the spectrum of the radiation beam is controlled to correct for overlay error along a direction of scanning of the lithographic apparatus.

16. The computer program product of claim 13, wherein the chromatic aberrations comprise at least one or more asymmetric wavefront aberrations which depend on the wavelength of the radiation beam.

17. The computer program product of claim 13, wherein the instructions are further configured to cause the computer system to generate a control signal, based on the determined spectrum, of a wavelength of at least one of the plurality of wavelength components.

18. The computer program product of claim 13, wherein the instructions are further configured to cause the computer system to generate a control signal, based on the determined spectrum, of a dose of at least one of the plurality of wavelength components.

19. The computer program product of claim 13, wherein the chromatic aberrations are associated with a tilt of the wavefront, the tilt of the wavefront is associated with a position shift of the pattern along a non-scanning direction being perpendicular to a scanning direction of the lithographic apparatus, and the spectrum of the radiation beam is controlled to correct for overlay error along the non-scanning direction.

20. The computer program product of claim 13, wherein the dependency of the tilt on the wavelength of the radiation beam varies along the scanning direction and wherein the instructions are further configured to cause the computer system to generate a control signal, based on the determined spectrum, to correct for overlay error variation along the scanning direction.

21. A computer program product comprising a non-transitory computer-readable medium having machine readable instructions therein for determining a spectrum of a radiation beam comprising a plurality of wavelength components used in forming an image of a patterning device on a substrate in a lithographic apparatus, wherein the lithographic apparatus comprises a projection system having chromatic aberrations, the instructions, when executed, configured to cause a computer system to at least:

obtain a dependency of a position on the substrate of a pattern associated with the patterning device on a wavelength of the radiation beam due to the chromatic aberrations; and determine, based on a desired position of the pattern on the substrate and the dependency, a change of the spectrum of the radiation beam during an exposure of target portion of the substrate.

* * * * *